United States Patent
Homma et al.

(10) Patent No.: US 7,161,567 B2
(45) Date of Patent: Jan. 9, 2007

(54) LIGHT EMITTING DEVICE AND APPARATUS USING THE SAME

(75) Inventors: Kenji Homma, Kyoto (JP); Takahiro Ayabe, Kyoto (JP); Hironobu Kiyomoto, Nara (JP)

(73) Assignee: Omron Corporation, Kyoto (JP)

( * ) Notice: Subject to any disclaimer, the term of this patent is extended or adjusted under 35 U.S.C. 154(b) by 607 days.

(21) Appl. No.: 10/727,175

(22) Filed: Dec. 3, 2003

(65) Prior Publication Data

US 2004/0119668 A1    Jun. 24, 2004

(30) Foreign Application Priority Data

Dec. 5, 2002    (JP)    ............... 2002-354279

(51) Int. Cl.
    *G09G 3/32*    (2006.01)
(52) U.S. Cl. .................... 345/82; 345/46; 359/267; 362/16
(58) Field of Classification Search ............ 345/82–84, 345/46; 359/247, 267, 318; 362/16, 555, 362/606
    See application file for complete search history.

(56) References Cited

U.S. PATENT DOCUMENTS

| 5,790,502 | A | * | 8/1998 | Horinouchi et al. ... | 369/112.09 |
| 5,903,091 | A | * | 5/1999 | MacLennan et al. ........ | 313/161 |
| 6,236,514 | B1 | * | 5/2001 | Sato ........................... | 359/664 |
| 6,518,691 | B1 | * | 2/2003 | Baba .......................... | 313/113 |
| 7,029,156 | B1 | * | 4/2006 | Suehiro et al. ............. | 362/560 |
| 2001/0028559 | A1 | * | 10/2001 | Tenmyo ....................... | 362/16 |
| 2002/0171950 | A1 | * | 11/2002 | Plank et al. ................ | 359/834 |
| 2003/0025852 | A1 | * | 2/2003 | Ishitake ...................... | 349/62 |
| 2003/0123262 | A1 | * | 7/2003 | Suehiro et al. ............. | 362/555 |

FOREIGN PATENT DOCUMENTS

| EP | 1 193 773 A2 | 4/2002 |
| EP | 1 235 281 A1 | 8/2002 |
| JP | 61-127186 | 6/1986 |

OTHER PUBLICATIONS

EPO, Patent Abstracts of Japan; English translation of Abstract for Japanese Publication No. 61-127186; Dated Jun. 14, 1986; (1 page).
European Search Report for EP Appl. No. 03104429.0—2203; Dated Dec. 16, 2005; (3 pages).

* cited by examiner

*Primary Examiner*—Richard Hjerpe
*Assistant Examiner*—Kimnhung Nguyen
(74) *Attorney, Agent, or Firm*—Osha Liang LLP

(57) ABSTRACT

A mold part formed of a light transmitting material having a high refractive index is molded in a concave-shaped reflecting member, and a light emitting element such as an LED chip or the like is inserted in the center of the mold part. A circular direct emitting portion is provided at the center of a front face of the mold part, a ring-shaped total reflecting portion is provided around it, and a slanted total reflecting portion is provided between the direct emitting portion and total reflecting portion. Thereby, the uniformity of front face luminance with a simple structure in a light emitting device provided with a reflecting member on a back face of a mold part is improved.

13 Claims, 30 Drawing Sheets

PRIOR ART

PRIOR ART

Fig. 32A
Fig. 32B
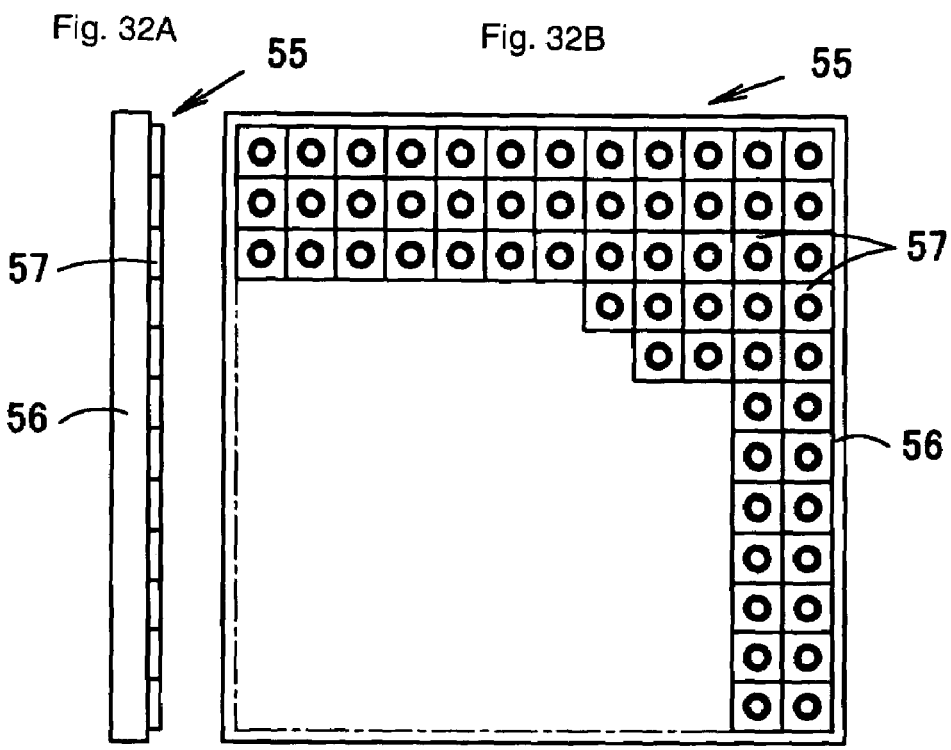
Fig. 32C
Fig. 32D
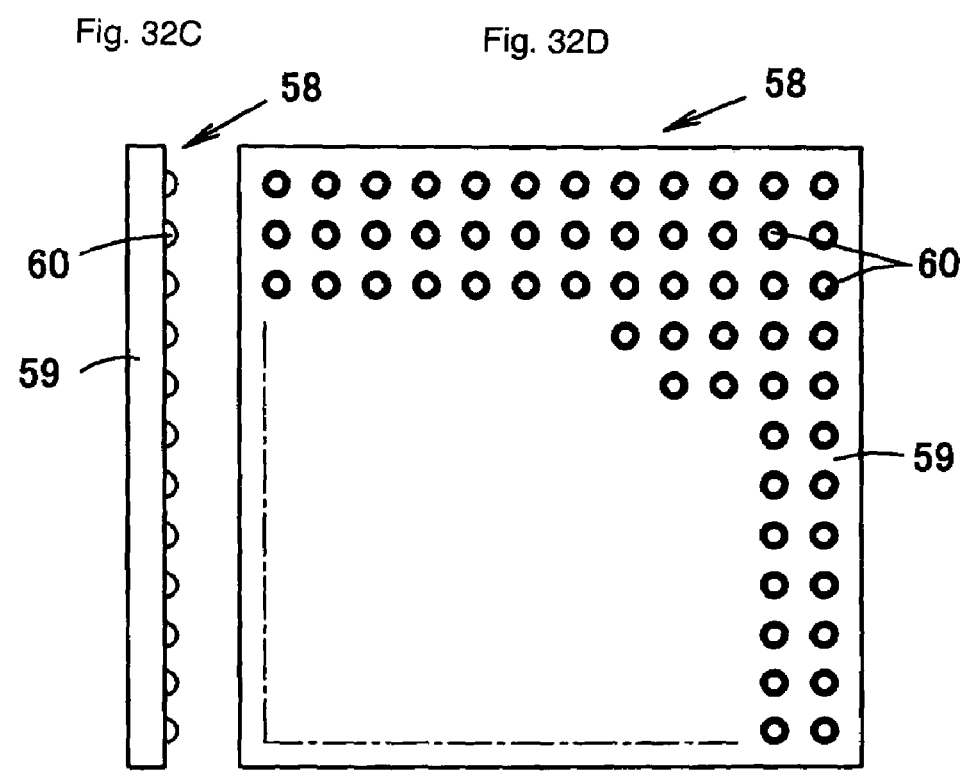
PRIOR ART
PRIOR ART

LIGHT EMITTING DEVICE AND APPARATUS USING THE SAME

BACKGROUND OF THE INVENTION

1. Field of the Invention

The present invention relates to a light emitting device and an apparatus using the light emitting device, and more particularly, to a light emitting device and a light emitting apparatus using an LED (light-emitting diode) chip or the like, and an apparatus such as a luminaire, a display unit or the like, which uses the light emitting device.

2. Description of the Background Art

As a small-type light emitting device, a cannonball-shaped LED in which an LED chip is sealed in a transparent mold resin is well known. According to the light emitting device, although the light emitted from the LED chip forward passes through an interface of the mold resin and directly emitted from the light emitting device, the light emitted from the LED chip in the slanted direction is totally reflected by the interface of the mold resin or scattered in its case, which becomes loss and lowers light usability. In addition, it is difficult to increase an area in such light emitting device.

Therefore, there has been conventionally proposed a thin and large light emitting device in which light emitted from an LED chip in the slanted direction can be also effectively emitted forward. FIG. 1 is a perspective view showing a structure of such light emitting device 1, FIG. 2A is a sectional view thereof and FIG. 2B is a graph showing distribution of its front face luminance. That light emitting device is disclosed in Japanese Unexamined Patent Publication No. 2002-94129 (patent document 1). According to the light emitting device 1, an LED chip 3 is sealed at a center in a transparent mold resin 2 which is in the shape of almost a dish, and a reflection mirror 4 in the shape of a concave mirror is provided on a back face of the mold resin 2. In addition, a direct emitting portion 5 in the shape of a convex lens is formed at a center of a front face of the mold resin 2, and a planar ring-shaped total reflecting portion 6 is formed around it.

Thus, when the LED chip 3 is energized and emits light, as shown in FIG. 2A, the light L emitted from the LED chip 3 toward the direct emitting portion 5 is refracted by a lens function when it passes through the direct emitting portion 5 in the shape of the convex lens, and emitted from the light emitting device 1 almost straight forward. In addition, the light L emitted from the LED chip 3 to the total reflecting portion 6 is totally reflected by the interface of the total reflecting portion 6, reflected by the reflection mirror 4, passes through the total reflecting portion 6 and emitted from the light emitting device 1 almost straight forward.

According to the light emitting device 1, the light L totally reflected by an inner periphery part of the total reflecting portion 6 is directed to the reflection mirror 4, reflected by the reflection mirror 4, reaches the total reflecting portion 6 again and then, emitted from the total reflecting portion 6. Thus, while the light L is directed from the total reflecting portion 6 to the reflection mirror 4, the light spreads to the outside of the inner peripheral part of the total reflecting portion 6, so that the light is emitted from the outer peripheral part of the total reflecting portion 6. Therefore, as shown in FIG. 2A, although the direct emitting portion 5 and the outer peripheral part of the total reflecting portion 6 are light emitting regions, light is not emitted from the inner peripheral part of the total reflecting portion 6 positioned between them and the inner peripheral part is a region where light is not emitted.

FIG. 2B is a graph schematically showing luminance distribution when viewed from the front face of the light emitting device 1, in a section through which a central axis of the light emitting device 1 passes, and FIG. 3 is a front view showing the light emitting device. As shown in FIGS. 2A and 2B, there is a region where the light is not emitted in the light emitting device 1. Thus, according to the conventional light emitting device 1, since a ring-shaped dark part (dark ring) having a wide width is generated when viewed from the front face, light cannot be uniformly emitted on the plane. Especially, when the light emitting device has a diameter of several centimeters, this dark part is very clearly seen and uniform planer light emission cannot be implemented.

In addition, Although Japanese Unexamined Patent Publication No. 2002-134794 (patent document 2) discloses a method of reducing the dark part by providing a ling-shaped reflection plate or a slit (air layer) at an outer peripheral part of the direct emitting portion, in this light emitting device, molding process of the mold part becomes complicated and after-process is necessary, which increases the cost.

SUMMARY OF THE INVENTION

According to one or more embodiments of the present invention, the uniformity of front face luminance with a simple structure in a light emitting device provided with a reflecting member on a back face of a mold part is improved.

According to a light emitting device of the present invention, in the light emitting device comprising a reflecting member reflecting light, a light guiding member arranged at the side of a light reflecting surface of the reflecting member, and a light emitting element for emitting light toward the light guiding member, it is characterized in that a face of the light guiding member on the light emission side comprises a direct emitting portion in which the light emitted from the light emitting element passes through to be emitted toward the outside of the light guiding member; a first total reflecting portion in which the light emitted from the light emitting element is totally reflected toward the reflecting member, and the light reflected by the reflecting member passes through to be emitted toward the outside of the light guiding member; and a second total reflecting portion configured such that the light emitted from the light emitting element is totally reflected toward the direct emitting portion, the light totally reflected by the direct emitting portion is directed to the reflecting member and the light reflected by the reflecting member is emitted toward the outside of the light guiding member.

According to the light emitting device of the present invention, since the second total reflecting portion in which the light from the light emitting element is totally reflected, totally reflected by the direct emitting portion, reflected by the reflecting member and emitted to the outside is provided, besides the direct emitting portion in which the light from the light emitting element is directly emitted, and the first total reflecting portion in which the light from the light emitting element is totally reflected, reflected by the reflecting member and emitted to the outside, distribution of the light emitted from the light guiding member can be controlled by varying a position and/or a configuration of the second total reflecting portion and the distribution of the front face luminance of the light emitting device can be uniformly provided.

Especially, according to an aspect of the present invention, since the second total reflecting portion is configured such that at least a part of the light reflected by the reflecting member after totally reflected by the second total reflecting portion and the direct emitting portion may be emitted from a region in which neither the light passing through the direct emitting portion nor the light reflected by the first total reflecting portion and the reflecting member is emitted, the light is emitted from the region which was the dark part when only the direct emitting portion and the first total reflecting portion were provided and uniformity of the front face luminance can be improved by lightening the dark part in the light emitting device.

Furthermore, the face of the light guiding member on the light emission side comprises a third total reflecting portion in which the light emitted from the light emitting element is totally reflected toward the reflecting member, and the light reflected by the reflecting member is emitted to the outside of the light guiding member; and the third total reflecting portion and the first total reflecting portion are positioned at different distances from the light emitting element. According to the third total reflecting portion, a part of the light emitted from the light emitting element can be controlled by varying a position and/or an angle where the third total reflecting portion is provided, and distribution of the front face luminance of the light emitting device can become further uniform.

Furthermore, according to still another aspect of the present invention, the third total reflecting portion and the second total reflecting portion may be arranged adjacently with each other. When the second and third total reflecting portions are adjacently arranged, the configuration of the light guiding member can be simple.

The reflecting member according to still another aspect of the present invention is divided into two regions, one in which the light totally reflected by the first total reflecting portion is reflected and the other in which the light totally reflected by the second total reflecting portion and the direct emitting portion is reflected. Thus, when the reflecting member is divided into regions corresponding to the first and second total reflecting portion, each region can be independently designed and the degree of freedom in designing the reflecting member is increased.

Furthermore, according to still another aspect of the present invention, the reflecting member in the light emitting device provided with the third total reflecting portion comprises a portion in which the light totally reflected by the first total reflecting portion is reflected, a portion in which the light totally reflected by the second total reflecting portion and the direct emitting portion is reflected, and a portion in which the light totally reflected by third total reflecting portion is reflected. Thus, when the reflecting member is divided into portions corresponding to the first, second and third total reflecting portion, each region can be independently designed and the degree of freedom in designing the reflecting member is increased.

Since the reflecting member according to still another aspect of the present invention, further comprises a region in which the light emitted from the light emitting element is reflected to be directly emitted from the front face of the light guiding member, the light emitted from the light emitting element in the horizontal direction at a large emission angle can be reflected by the reflecting member and emitted from the front face, so that light usability can be improved.

According to still another aspect of the present invention in the light emitting device provided with the third total reflecting portion, since a light transmitting medium having a refractive index different from that of the light guiding member is filled in a concave portion which was generated in the light guiding member by arranging the first total reflecting portion and the third total reflecting portion at different distances from the light emitting element, so as to form a surface which is contiguous to at least one of the first total reflecting portion and the third total reflecting portion, dirt and/or dust will not be piled up in the groove and the light can be prevented from being scattered or obscured. Consequently, deterioration of the light emitting device due to dirt can be prevented.

According to still another aspect of the present invention, since the whole of the face of the light guiding member on the light emission side is covered with a light transmitting medium having a refractive index different from that of the light guiding member, dirt and/or dust will not be piled up in concave and convex parts on the surface of the light guiding member and the light can be prevented from being scattered or obscured. Consequently, deterioration of the light emitting device due to dirt can be prevented. Furthermore, when a material having hardness higher than the light guiding member 12 is used as the light transmitting material, the light guiding member can be protected.

According to still another aspect of the present invention, since a light transmitting region in which light diffusing elements or phosphors are dispersed is formed between the light emitting element and the light guiding member, the light emitted from the light emitting element can be scattered by the diffusion agent or secondly emitted by phosphors, so that the light emitting element can be enlarged apparently.

According to a light emitting apparatus of the present invention, a plurality of the light emitting devices according to the present invention are connected to each other and it is characterized in that the reflecting member is configured such that the light which was leaked from one of the adjacent light emitting devices to the light guiding member of the other light emitting device may be reflected by the reflecting member of the other light emitting device and emitted from the face of the other light emitting device on the light emission side.

According to the light emitting apparatus of the present invention, since the light which was leaked from one light emitting device to the other light emitting device can be reflected by the reflecting member of the other light emitting device and emitted from the other light emitting device, the leaked light from one light emitting device can be used again and then the light usability can be further improved.

A luminaire according to the present invention is characterized by comprising a light emitting apparatus in which a plurality of light emitting devices of the present invention are arranged, and a power supply unit supplying a power to the light emitting apparatus. According to the luminaire, there can be provided a thin and large light apparatus that can emit light uniformly. Furthermore, since it is provided with the power supply unit, it can be carried.

A display unit according to the present invention is characterized by comprising a light emitting apparatus in which a plurality of light emitting devices of the present invention are arranged, and a controller controlling lighting of each light emitting device which constitutes the light emitting apparatus. According to the display unit, there can be provided a display unit that is light in weight, thin and large and has uniform light emission face. Besides, since it is provided with the controller, various kinds of displays can be implemented and it can be optimally used for an advertisement, a display, and a traffic light.

In addition, the components of the present invention described above can be arbitrarily combined as much as possible.

BRIEF DESCRIPTION OF THE DRAWINGS

FIGS. 32A and 32B show side and front views of a light source apparatus in which square or rectangular light emitting devices are arranged on the whole surface of a substrate leaving no space among them, and FIGS. 32C and 32D show side and front views of a light source apparatus in which the conventional light emitting devices are arranged on the whole surface of a substrate at the same pitch.

DETAILED DESCRIPTION OF THE INVENTION (First Embodiment)

Figure 4:
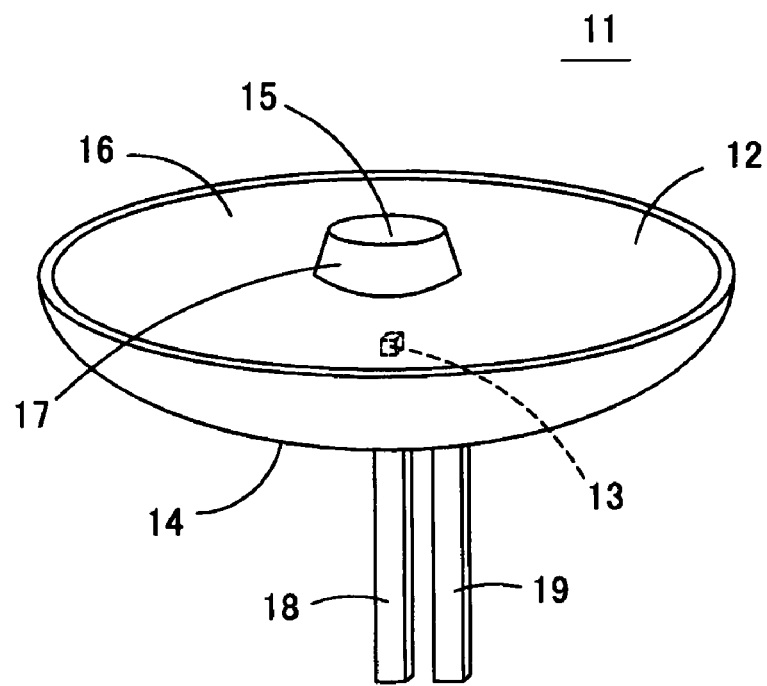
FIG. 4 shows a perspective view of a structure of a light emitting device according to an embodiment of the present invention.
Figure 5B:
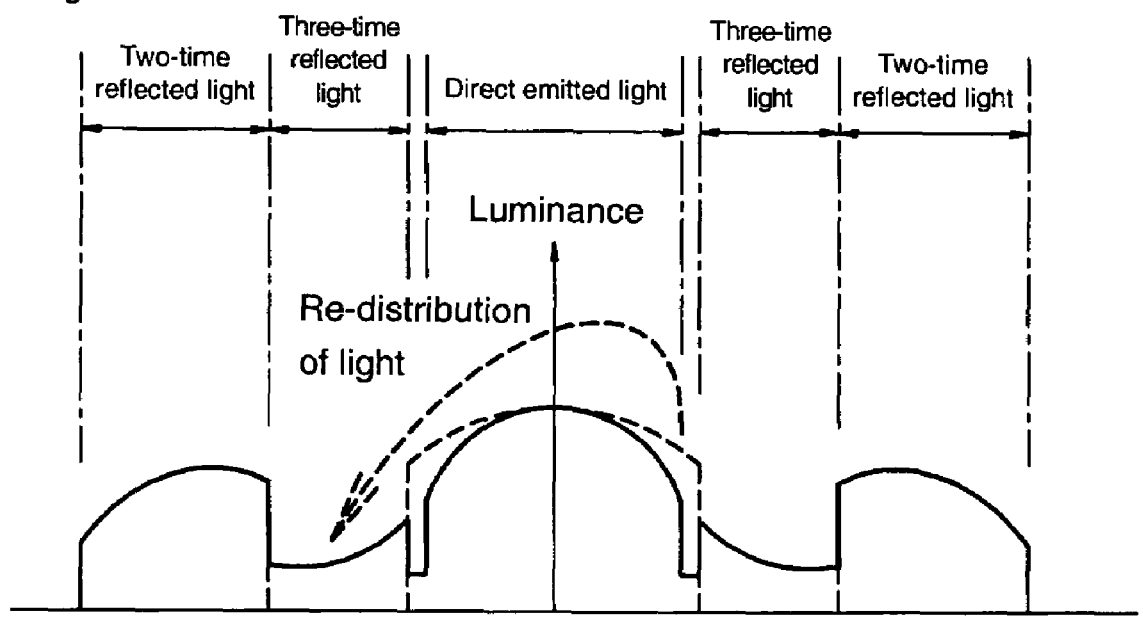
FIG. 5A shows a sectional view of the above light emitting device and FIG. 5B shows a graph of luminance distribution at a front face of the light emitting device.
Figure 5A:
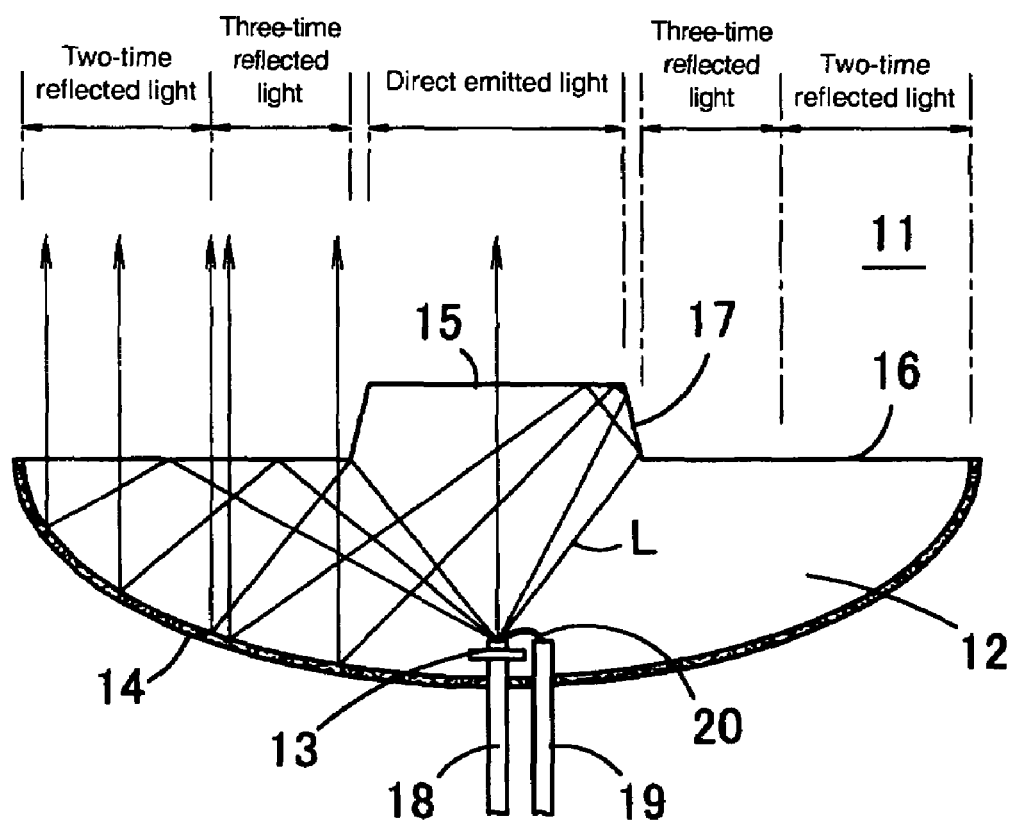

FIG. 4 is a perspective view showing a structure of a light emitting device 11 according to an embodiment of the present invention, FIG. 5A is a sectional view thereof, and FIG. 5B is a view showing luminance distribution at the front face of the light emitting device 11. A mold part (light guiding member) 12 in the shape of almost a dish is molded with a light transmitting material having high refractive index, such as a transparent resin in the light emitting device 11. As the light transmitting material constituting the mold part 12, a light transmitting resin such as an epoxy resin or an acrylate resin may be used or a glass material may be used. A light emitting element 13 such as an LED chip or a lamp is die bonded on a stem formed on an end of one lead terminal 18, and the light emitting element 13 is electrically connected to the other lead terminal 19 by a bonding wire 20. The light emitting element 13 and the ends of the lead terminals 18 and 19 are sealed in the mold part 12 and the light emitting element 13 is positioned at the center on the side of the back face of the mold part 12.

A reflecting member 14 in the shape of a concave mirror is provided on the back face of the mold part 12, which reflects light totally reflected by the front face of the mold part 12, in the forward direction. The reflecting member 14 may be a metal film such as Au, Ag, Al or the like which is elaborated on the back face of the mold part 12, it may be a metal plate such as an aluminum plate in which its surface is mirror finished to have a high reflection coefficient, or it may be a curved plate such as metal or a resin in which Au, Ag, Al or the like is plated on its surface.

A direct emitting portion 15 in the shape of a circle (that is, a perfect circle, an ellipse or the like) is provided at the center on the front face of the mold part 12, and a ring-shaped total reflecting portion (a first total reflecting portion) 16 is provided around it. A slanted total reflecting portion (a second total reflecting portion) 17 is provided between the direct emitting portion 15 and the total reflecting portion 16. The direct emitting portion 15 is a flat and circular region formed on a plane which is perpendicular to a central axis of the mold part 12, and the total reflecting portion 16 is also a flat and circular region formed on a plane which is perpendicular to the central axis of the mold part 12. In addition, the slanted total reflecting portion 17 is tapered such that its diameter is gradually decreased toward the side of the front face of the mold part 12, and the direct emitting portion 15 and the slanted total reflecting portion 17 project forward in the shape of a truncated cone at the center of the total reflecting portion 16.

Thus, when the light emitting element 13 is energized through the lead terminals 18 and 19, as shown in FIG. 5A, the light L emitted from the light emitting element 13 toward the direct emitting portion 15 passes through the direct emitting portion 15 and is directly emitted forward from the light emitting device 11. In addition, the light L emitted from the light emitting element 13 toward the total reflecting portion 16 is totally reflected by the total reflecting portion 16, impinges on the reflecting member 14, reflected by the reflecting member 14, and then, emitted from a region in the total reflecting portion 16 other than its inner peripheral part in the forward direction of the light emitting device 11. Meanwhile, the incident light L on the slanted total reflecting portion 17 from the light emitting element 13 is totally reflected by the slanted total reflecting portion 17 to impinge on a periphery part of the direct emitting portion 15, it is totally reflected by the direct emitting portion 15 to impinge on the reflecting member 14, and it is reflected by the reflecting member 14 to be emitted in the forward direction of the light emitting device 11. In this case, the light L reflected by the slanted total reflecting portion 17, the peripheral part of the direct emitting portion 15 and the reflecting member 14 three times is designed so as to be emitted from a dark part. According to the present invention, the dark part is positioned between the direct emitting portion 15 and a region (the outer periphery of the total reflecting portion 16) from which the light reflected by the total reflecting portion 16 and the reflecting member 14 two times is emitted, that is, a region from which neither the light directly emitted from the direct emitting portion 15 nor the light reflected by the total reflecting portion 16 and the reflecting member 14 two times is emitted.

Figure 1:
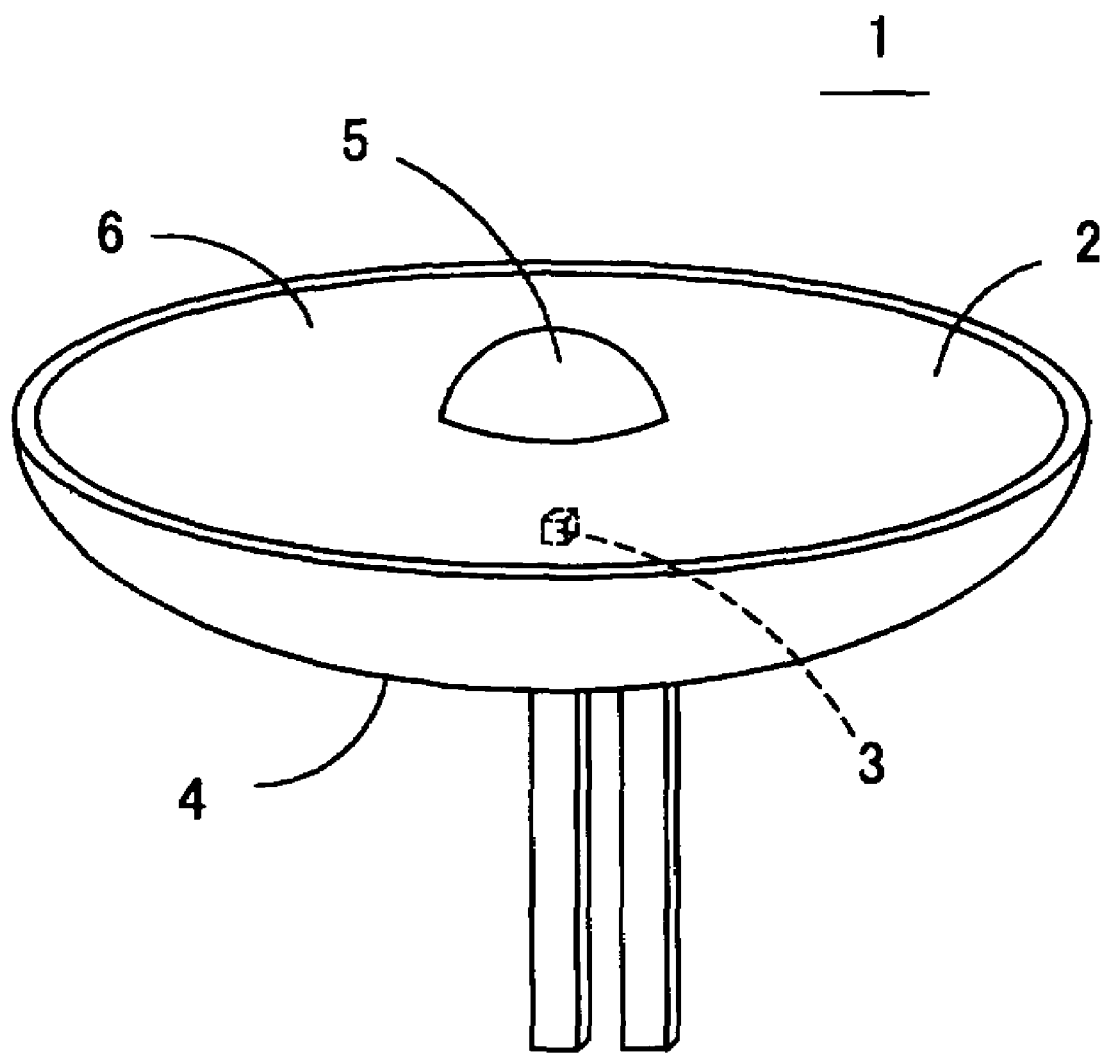
FIG. 1 shows a perspective view of a structure of a light emitting device according to a conventional example.
Figure 2B:
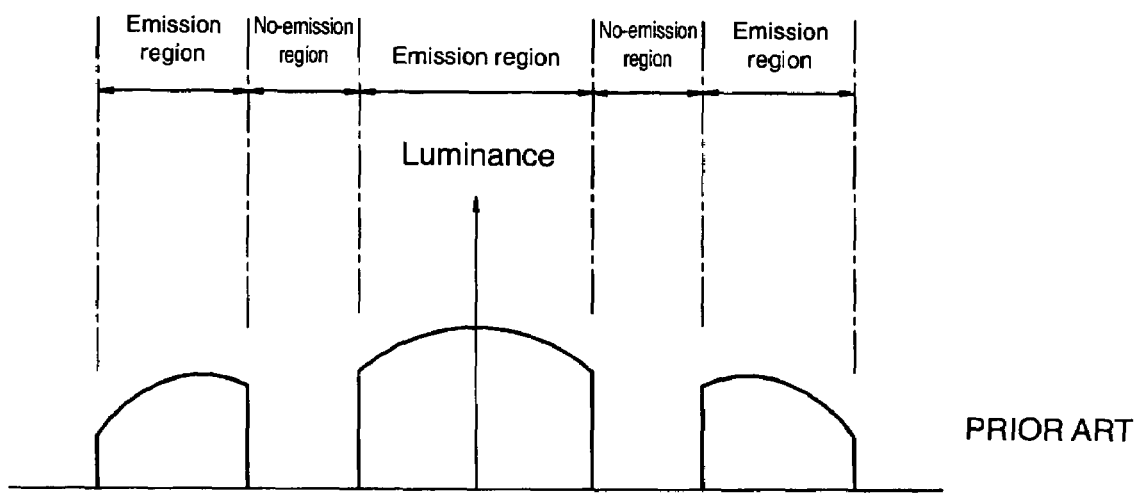
FIG. 2A shows a sectional view of a structure of the above light emitting device and FIG. 2B shows a graph of distribution of front face luminance thereof.
Figure 2A:
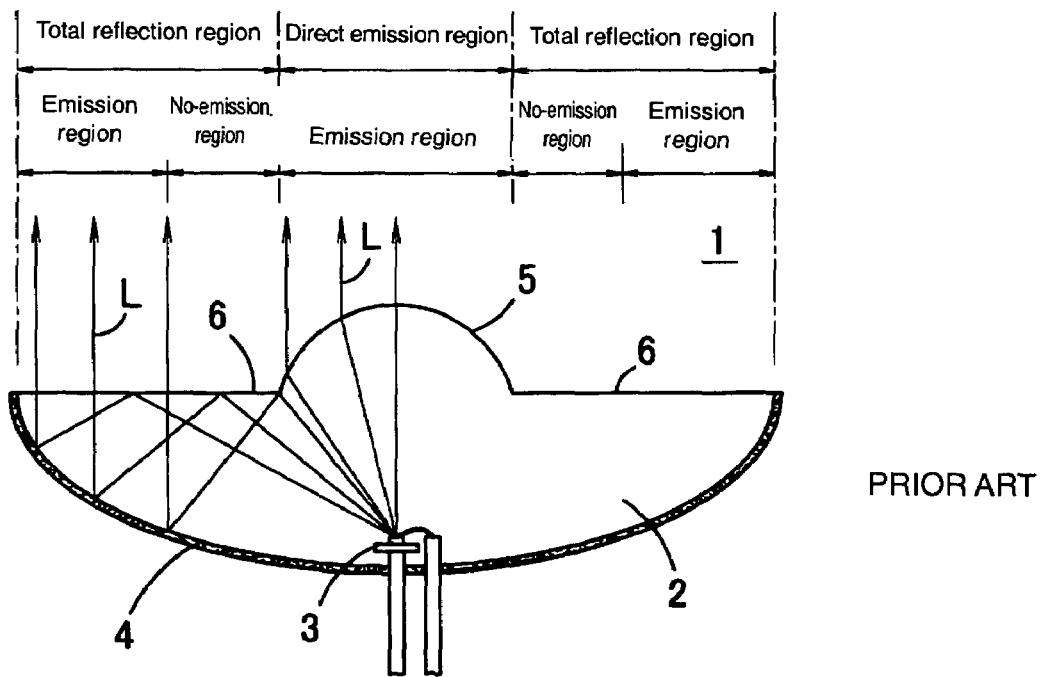
Figure 3:
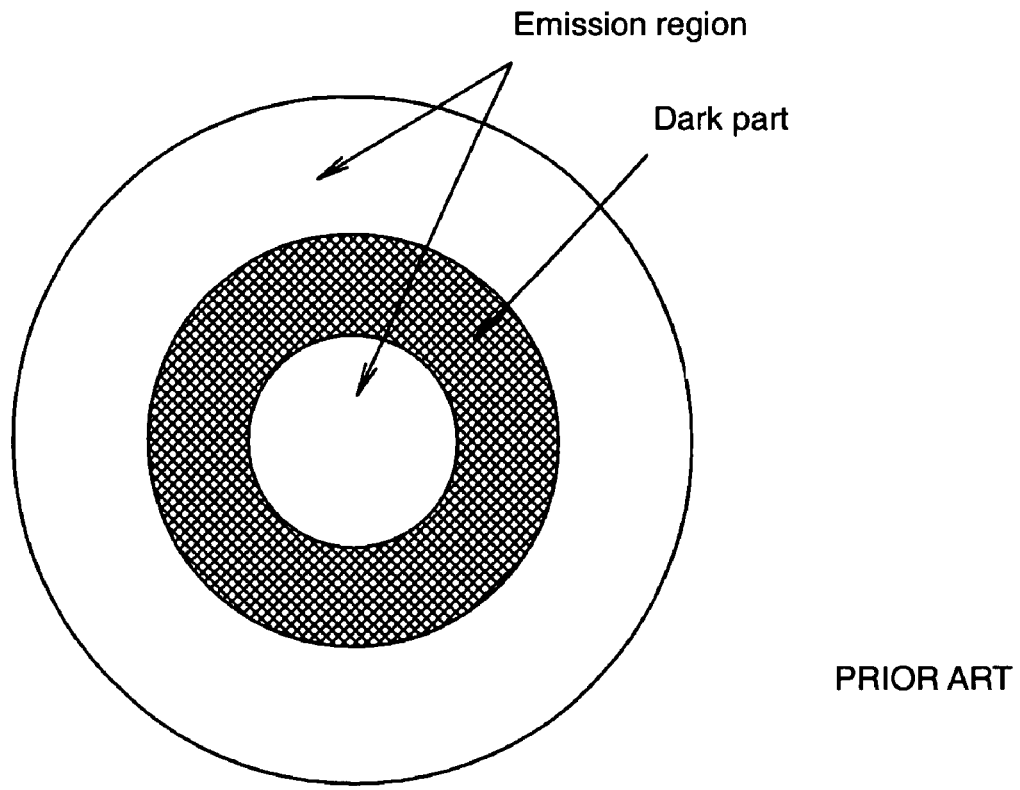
FIG. 3 shows a front view of the lighting light emitting device of the above.

FIG. 5B is a graph in which luminance of light emitted from the light emitting device 11 according to this embodiment is compared with that emitted from the conventional light emitting device 1. In FIG. 5B, intensity distribution designated by a dotted line shows luminance distribution of the light emitted from the light emitting device 1 in FIG. 1 (which is the same as that in FIG. 2B). In FIG. 5B, luminance distribution designated by a solid line shows intensity distribution of the light emitted from the light emitting device 11 according to this embodiment in which the direct emitting portion 5 in the conventional example is replaced with the direct emitting portion 15 and the slanted total reflecting portion 17 (the region of the total reflecting portion 6 coincides with the region of the total reflecting portion 16). In this case, as can be seen from FIG. 5A, when the slanted total reflecting portion 17 is provided at the region corresponding to the outer peripheral part of the direct emitting portion 5, since a part of the light directly emitted from the outer peripheral part of the direct emitting portion 5 is distributed again to the region which was the dark part (opposite side across the central axis of the mold part 12) and can be emitted from the dark part, the luminance of the light emitted from the light emitting device 11 can be made to be uniform by reducing the dark part.

Figure 6B:
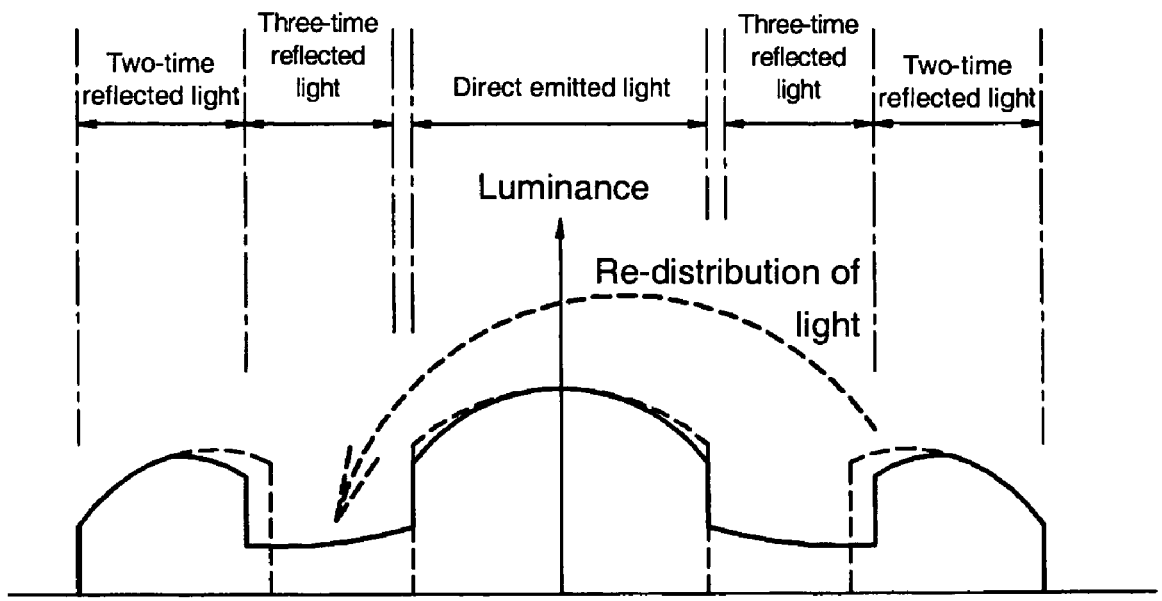
FIG. 6A shows a sectional view of a light emitting device in which a position of a slanted total reflecting portion is differentiated a little and FIG. 6B shows a graph comparing luminance distribution of light emitted from the light emitting device with that from the conventional light emitting device.
Figure 6A:
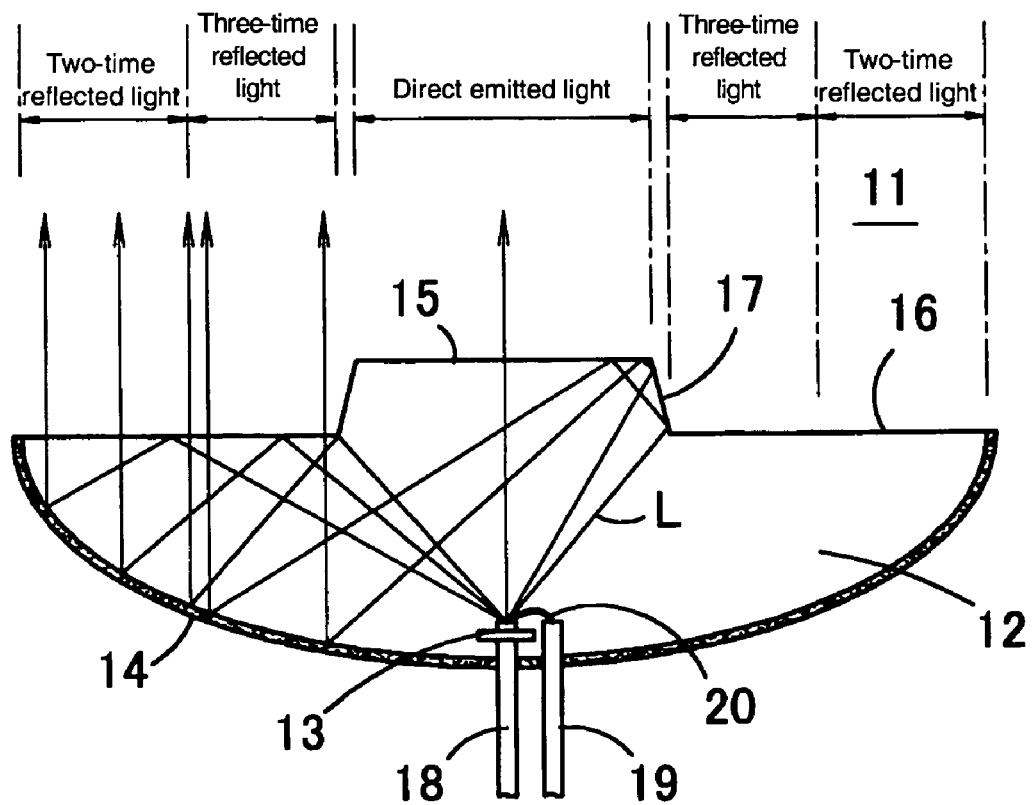

FIG. 6A is a view showing a light emitting device according to this embodiment, in which the slanted total reflecting portion 17 is a little differentiated and FIG. 6B is a graph in which luminance distribution of light emitted from the light emitting device 11 is compared with that emitted from the conventional light emitting device 1. In FIG. 6B, intensity distribution designated by a dotted line shows intensity distribution of the light emitted from the light emitting device 1 in FIG. 1 (which is the same as that in FIG. 2B). In FIG. 6B, intensity distribution designated by a solid line shows luminance distribution of the light emitted from the light emitting device 11 according to this embodiment in which the slanted total reflecting portion 17 is formed at the inner peripheral part of the total reflecting portion 6 in the conventional example and the direct emitting portion 5 in the shape of a lens is replaced with the flat direct emitting portion 15. In this case, as can be seen from FIG. 6A, when the slanted total reflecting portion 17 is provided at the inner peripheral part of the total reflecting portion 6, since a part of the light emitted from the outer peripheral part of the dark part in the total reflecting portion 16 is distributed again and emitted from the dark part, luminance of the light emitted from the light emitting device 11 can be made to be uniform.

In addition, in a case where the slanted total reflecting portion 17 is provided at the middle position between those in FIG. 5A and FIG. 6B, since the light emitted from the outer peripheral part of the direct emitting portion 5 and the light emitted from the total reflecting portion 6 after totally reflected by the inner peripheral part of the total reflecting portion 6 are led to a place which was the dark part and emitted, the luminance of the light emitted from the light emitting device 11 can be also made to be uniform.

According to a light emitting device described in Japanese Unexamined Patent Publication No. 2002-134794 (patent document 2), since a ring-shaped reflection plate is inserted or a slit (air layer) is provided at an outer peripheral part of the direct emitting portion, molding process becomes complicated and after-process is necessary. However, according to the present invention, since the luminance of the dark part can be improved to make the luminance uniform only by changing a front face configuration of the mold part of the light emitting device, the light emitting device can be structured simply and its cost can be prevented from being increased.

Figure 7:
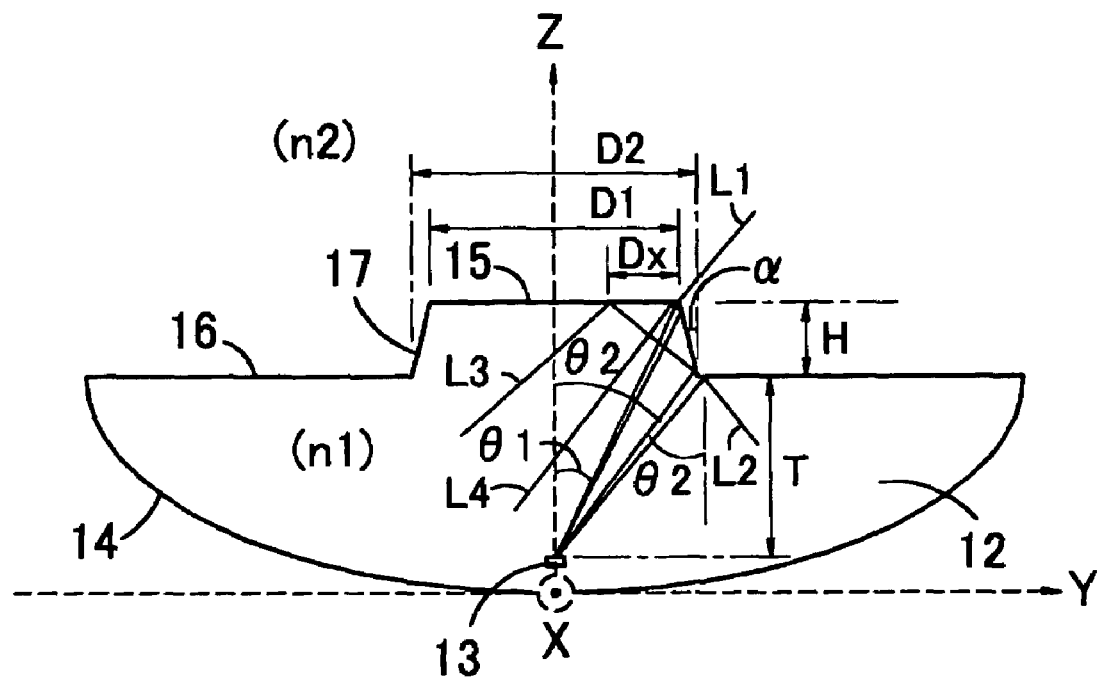
FIG. 7 shows a view for explaining a condition of arrangement of each part in the light emitting device shown in FIG. 5.

Then, according to this embodiment, a condition in which the incident light L on the direct emitting portion 15 passes through its interface, a condition in which the incident light on the total reflecting portion 16 is totally reflected by the interface, and a condition in which the incident light on the slanted total reflecting portion 17 is totally reflected by the interface and the direct emitting portion 15 two times are to be found. As shown in FIG. 7, it is assumed that an outer diameter of the direct emitting portion 15 is D1, a diameter of a lower periphery of the slanted total reflecting portion 17 is D2 (D2≧D1), a height from the lower end to the upper end of the slanted total reflecting portion 17 in the vertical direction is H, a depth of an inserted position of the light emitting element 13 from the lower end of the slanted total reflecting portion 17 in the vertical direction is T, and an inclination of the slanted total reflecting portion 17 in the section where a shaft center of the mold part 12 penetrates is α. In addition, a relation between the inclination α of the slanted total reflecting portion 17, the height H of the slanted total reflecting portion 17, the outer diameter D1 of the direct emitting portion 15 and the inner diameter D2 of the total reflecting portion 16 is that $$\tan \alpha = (D2-D1)/(2H)$$

that is, $$D2 = D1 + 2H \tan \alpha \tag{1}$$

In addition, it is assumed that a refractive index of the mold part 12 is n1 and a refractive index of a medium contacting the front face of the mold part 12 is n2. According to this embodiment, although the front face of the mold part 12 is an interface between the resin and air, the front face of the mold part 12 may be an interface with a different resin, a multilayer reflection film or the like, and in this case, the refractive index n2 is a refractive index of a medium such as the different resin contacting the front face of the mold part 12.

The condition in which incident light on the direct emitting portion 15 is emitted from the direct emitting portion 15 like a light beam L1 shown in FIG. 7 is found as follows. That is, when it is assumed that an angle formed between the light beam L1 emitted from the light emitting element 13 to the outer peripheral end of the direct emitting portion 15 and a central axis (Z axis) of the mold part 12 is θ1, the equation is as follows, $$\tan \theta 1 = D1/[2(H+T)],$$

that is, $$\theta 1 = \arctan [D1/2(H+T)] \tag{2}$$

In order to emit the light beam L1 to the outside without being totally reflected, since the incident angle θ1 on the interface has to be smaller than a critical angle θ0=arc sin(n2/n1) of total reflection, the condition is expressed by the following equation (3).

$$\arctan [D1/2(H+T)] < \theta 0$$

that is, $$D1 < 2(H+T)\tan \theta 0 \tag{3}$$

Then, the condition in which incident light on the total reflecting portion 16 is totally reflected like a light beam L2 shown in FIG. 7 is found as follows. That is, when it is assumed that an angle formed between the light beam L2 emitted from the light emitting element 13 to the inner peripheral end of the total reflecting portion 16 and the central axis (Z axis) of the mold part 12 is θ2, the equation is provided as follows, $$\tan \theta 2 = D2/(2T)$$

that is, $$\theta 2 = \arctan [D2/(2T)] \tag{4}$$

In order to totally reflect the light beam L2, since the incident angle θ2 on the interface has to be the critical angle θ0 of the total reflection or more, the condition is expressed by the following equation (5).

$$\arctan [D2/(2T)] \geq \theta 0$$

When the above equation (1) is used, this becomes that $$D1 \geq 2(T \tan \theta 0 - H \tan \alpha) \tag{5}$$

In addition, the condition in which incident light on the lower end of the slanted total reflecting portion 17 is totally reflected by the slanted total reflecting portion 17 and the direct emitting portion 15 like a light beam L3 shown in FIG. 7 is found as follows. Since an angle formed between the light beam L3 emitted from the light emitting element 13 to the lower end of the slanted total reflecting portion 17 and the central axis (Z axis) of the mold part 12 is the same as θ2 which is expressed by the equation (4), the incident angle θ3 of the light beam L3 on the slanted total reflecting portion 17 is expressed as follows using the inclination a of the slanted total reflecting portion 17.

$$\theta 3 = 90° - \alpha - \theta 2 = 90° - \alpha - \arctan [D2/(2T)] \tag{6}$$

In order to totally reflect the light beam L3 at the slanted total reflecting portion 17, since the incident angle θ3 has to be the critical angle θ0 of the total reflection or more, the condition in which the light beam is totally reflected by the lower end of the slanted total reflecting portion 17 is expressed by the following equation (7) using the above equation (1).

$$90° - \alpha - \arctan [D2/(2T)] \geq \theta 0$$

that is, $$D1 \leq 2T \cot(\alpha + \theta 0) - 2H \tan \alpha \tag{7}$$

Then, an incident angle θ4 of the light beam L3 totally reflected by the lower end of the slanted total reflecting portion 17 on the direct emitting portion 15 is as follows.

$$\theta 4 = 2\alpha + \theta 2 = 2\alpha + \arctan [D2/(2T)] \tag{8}$$

In order to totally reflect the light beam L3 at the direct emitting portion 15, since the incident angle θ4 has to be the critical angle θ0 of total reflection or more, the condition in which the light beam L3 totally reflected by the lower end of the slanted total reflecting portion 17 is totally reflected by the direct emitting portion 15 also is expressed by the following equation (9).

$$2\alpha + \text{arc tan }[D2/(2T)] \geq \theta0$$

that is, $$D1 \geq 2T\tan(\theta0 - 2\alpha) - 2H\tan\alpha \quad (9)$$

Furthermore, the condition in which incident light on the upper end of the slanted total reflecting portion 17 is totally reflected by the slanted total reflecting portion 17 and the direct emitting portion 15 like a light beam L4 shown in FIG. 7 is found as follows. That is, since an angle formed between the light beam L4 emitted from the light emitting element 13 to the upper end of the slanted total reflecting portion 17 and the central axis (Z axis) of the mold part 12 is the same as θ1 which is expressed by the equation (2), an incident angle θ5 of the light beam L4 on the slanted total reflecting portion 17 is expressed as follows.

$$\theta5 = 90° - \alpha - \theta1 \quad (10)$$
$$= 90° - \alpha - \arctan[D1/2(H+T)]$$

In order to totally reflect the light beam L4 at the slanted total reflecting portion 17, since the incident angle θ5 has to be the critical angle θ0 of total reflection or more, the condition in which the light beam L4 is totally reflected by the upper end of the slanted total reflecting portion 17 is expressed by the following equation (11).

$$90° - \alpha - \text{arc tan }[D1/2(H+T)] \geq \theta0$$

that is, $$D1 \leq 2(H+T)\cot(\alpha + \theta0) \quad (11)$$

Then, an incident angle θ6 at which the light L4 totally reflected by the upper end of the slanted total reflecting portion 17 on the direct emitting portion 15 is as follows.

$$\theta6 = 2\alpha + \theta1 = 2\alpha + \text{arc tan }[D1/2(H+T)] \quad (12)$$

In order to totally reflect the light at the direct emitting portion 15, since the incident angle θ6 has to be the critical angle θ0 of total reflection or more, the condition in which the light L3 totally reflected by the upper end of the slanted total reflecting portion 17 is also totally reflected by the direct emitting portion 15 is expressed by the following equation (13).

$$2\alpha + \text{arc tan }[D1/2(H+T)] \geq \theta0$$

that is, $$D1 \geq 2(H+T)\tan(\theta0 - 2\alpha) \quad (13)$$

Furthermore, the condition in which the light reflected by the slanted total reflecting portion 17 impinges on the direct emitting portion 15 without impinging on an opposed surface of the slanted total reflecting portion 17 is to be considered. As shown in FIG. 7, when a distance between an incident point at which the light L3 totally reflected by the lower end of the slanted total reflecting portion 17 impinges on the direct emitting portion 15 and an outer edge of the direct emitting portion 15 is assumed to be Dx, the following equation is provided.

$$Dx = H[\tan(\theta2 + 2\alpha) - \tan\alpha] \quad (14)$$

Since the condition in which the light reflected by the slanted total reflecting portion 17 is reflected by the direct emitting portion 15 and then, reaches the reflecting member 14 without being interrupted by the opposed region of the slanted total reflecting portion 17 is that D1/2 is more than Dx, the following equation is provided.

$$D1 \geq 2H[\tan(\theta2 + 2\alpha) - \tan\alpha] \quad (15)$$

is provided.

Besides, the light totally reflected by the slanted total reflecting portion 17 and the direct emitting portion 15 has to be emitted from the whole of the dark part (in which neither the light penetrating the direct emitting portion 15 nor the light reflected by the total reflecting portion 16 and the reflecting member 14 is emitted). Since the condition for this depends on a curved configuration of the reflecting member 14, although detailed description is omitted, it is necessary to irradiate the light totally reflected by the slanted total reflecting portion 17 and the direct emitting portion 15 to the reflecting member 14 in a region which overlaps the dark part when viewed from the front face (Z axis direction), and reflect it in the direction perpendicular to the total reflecting portion 16.

Although the above equations (3), (5), (7), (9), (11), (13) and (15) are preferably satisfied as the most desirable light emitting device 11, (however, when the equation (7) is satisfied, the equation (11) is satisfied and when the equation (13) is satisfied, the equation (9) is satisfied, so that only five equations (3), (5), (7), (13) and (15) should be considered substantially), since the object of the present invention is to improve the uniformity of luminance by sending the light to the dark part, it does not matter even if the above equations are not all satisfied. For example, real designing may be implemented by priorities of the equations (7), (13) and (15) in this order.

The curved configuration of the reflecting member 14 is preferably designed such that the light is uniformly emitted from the front face of the light emitting device 11 as much as possible. For example, when the front face configuration of the light emitting device 11 is a circle, a conic face such as expressed by the following equation (16) can be provided.

[Equation 1] (16)

$$Z = \frac{CV\rho^2}{1 + \sqrt{1 - CV^2(CC+1)\rho^2}} + A\rho^4 + B\rho^6 + C\rho^8 + D\rho^{10} + \ldots$$

However, $\rho = \sqrt{X^2 + Y^2}$ where X, Y and Z constitute orthogonal coordinates in which a center of the reflecting member 14 is a starting point as shown in FIG. 7, and the Z axis coincides with the light axis of the reflecting member 14 and the central axis of the mold part 12. In addition, CV is a curvature (constant number) of the reflecting member 14, CC is a conic coefficient, and A, B, C, D, . . . are fourth, sixth, eighth, tenth, . . . aspheric coefficients, respectively.

In addition, as the curved configuration of the reflecting member 14, when the front face configuration of the light emitting device 11 is almost an ellipsoid, it can be a biconic face such as expressed by the following equation (17).

[Equation 2]

$$Z = \frac{cvxX^2 - cvY^2}{1 + \sqrt{1 - cvx^2(ccx+1)X^2 - cv^2(cc+1)Y^2}} + aX^4 + bY^4 + cX^6 + dY^6 + \ldots \quad (17)$$

where X, Y and Z constitute orthogonal coordinates in which a center of the reflecting member 14 is a starting point also, and the Z axis coincides with the light axis of the reflecting member 14 and the central axis of the mold part 12. In addition, when the equation (17) is expressed such that Z=G (X, Y), a curvature (constant number) of a curve expressed by Z=G(X, Y) is cv and a conic coefficient is cc, and a curvature (constant number) of curve expressed by Z=G (0, Y) is cvx ($\neq$cv) and a conic coefficient is ccx. In addition, a, b, c, d, . . . are high-order aspheric coefficients, respectively.

Although the configuration of the reflecting member 14 is not limited to the conic face or the biconic face, when it is the conic or biconic face, the light emitting device 11 can emit light further uniformly.

(Second Embodiment)

Figure 8A:
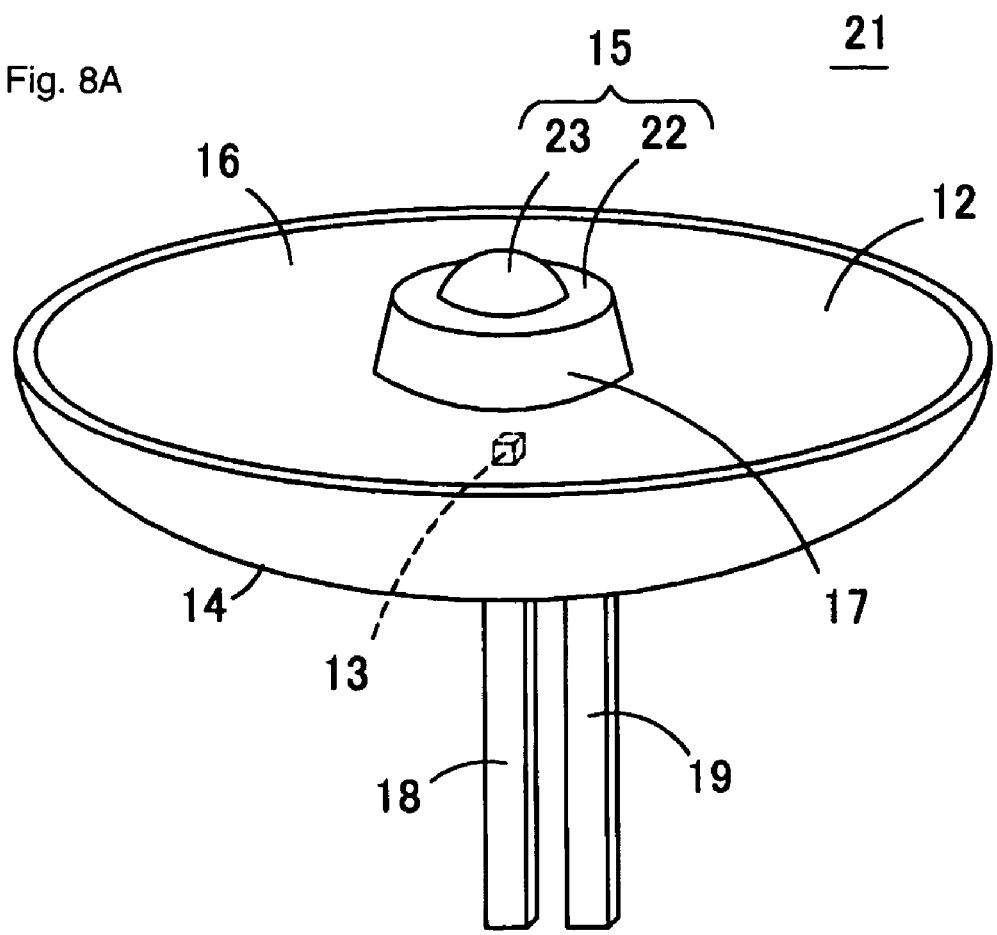
FIG. 8A shows a perspective view of a structure of a light emitting device according to another embodiment of the present invention and FIG. 8B shows a sectional view thereof.
Figure 8B:
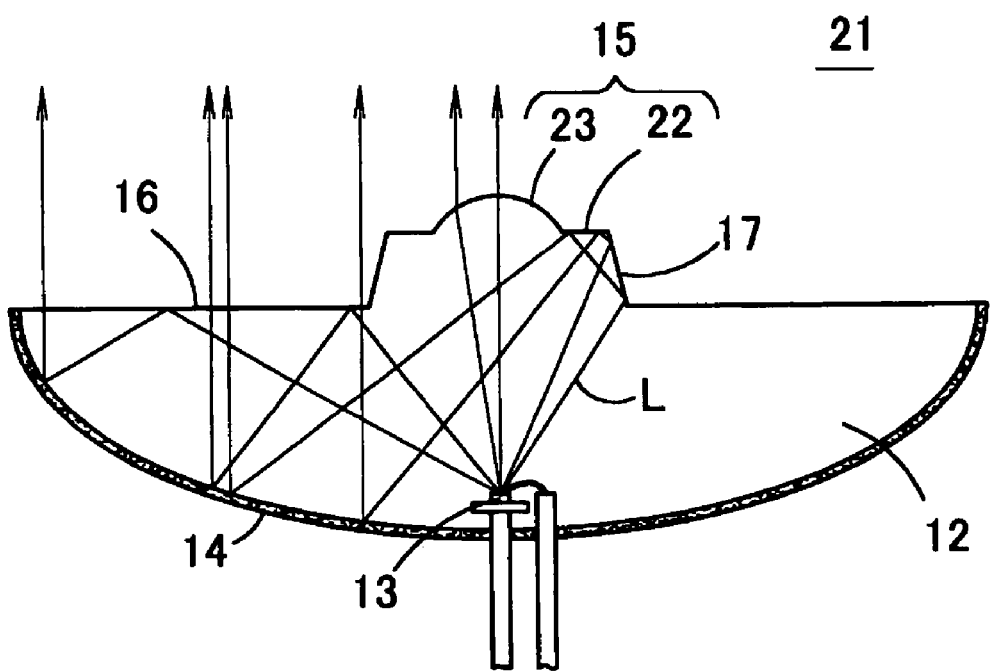

FIG. 8A is a perspective view showing a structure of a light emitting device 21 according to another embodiment of the present invention, and FIG. 8B is a sectional view thereof. According to the light emitting device 21, a flat face 22 for totally re-reflecting the light L which was totally reflected by a slanted total reflecting portion 17 is formed at a peripheral part of the direct emitting portion 15, and a lens face 23 is formed in a region other than the peripheral part of the direct emitting portion 15.

According to the embodiment shown in FIG. 4, since the direct emitting portion 15 is the flat face, the light L emitted from a region other than a central part of the direct emitting portion 15 is emitted in the direction slanted from the central axis. However, according to the light emitting device 21 of this embodiment, the region required for totally re-reflecting the light L which was totally reflected by the slanted total reflecting portion 17 is the flat face 22, and the lens face 23 in the shape of a convex lens or Fresnel lens is formed in the region in which the above operation is not required, as the direct emitting portion 15. Thus, the light L directly emitted from the lens face 23 is output forward in the direction parallel to the central axis. Therefore, according to this embodiment, the light emitted in the slanted direction is reduced and usability of the light can be improved.

Figure 9:
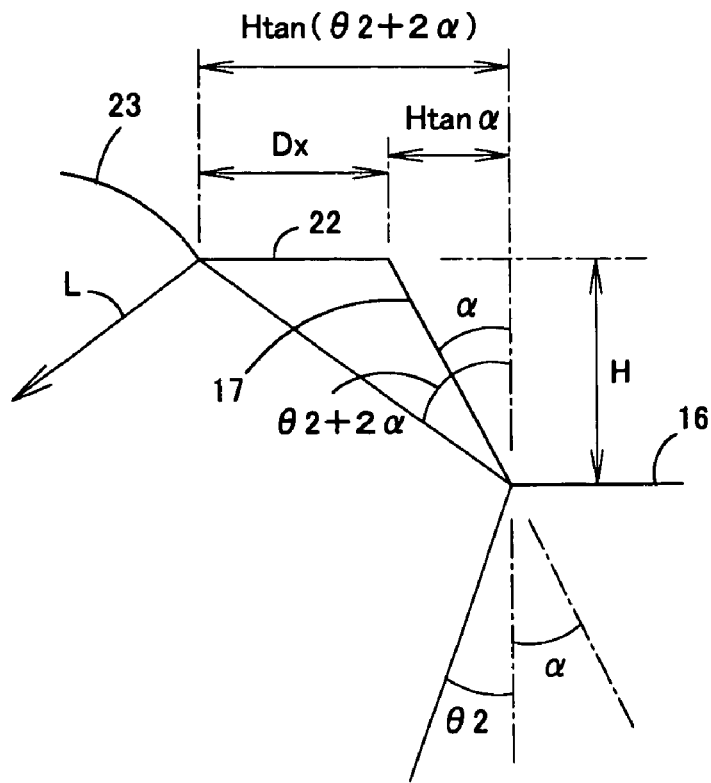
FIG. 9 shows a view for calculating a minimum width Dx of a flat face in the above light emitting device, which is required in theory.

FIG. 9 is a reference view for calculating the minimum width Dx of the flat face 22, which is required in theory. When it is assumed that an emission angle of the light L emitted from the light emitting element 13 toward the lower end of the slanted total reflecting portion 17 is $\theta 2$, an inclination of the slanted total reflecting portion 17 is $\alpha$, and a height of the slanted total reflecting portion 17 is H, the width Dx of the ring-shaped flat face 22 is found from FIG. 9 as follows. In addition, the width Dx is the same as in the equation (14).

$$Dx = H[\tan(\theta 2 + 2\alpha) - \tan \alpha] \quad (18)$$

(Third Embodiment)

Figure 10:
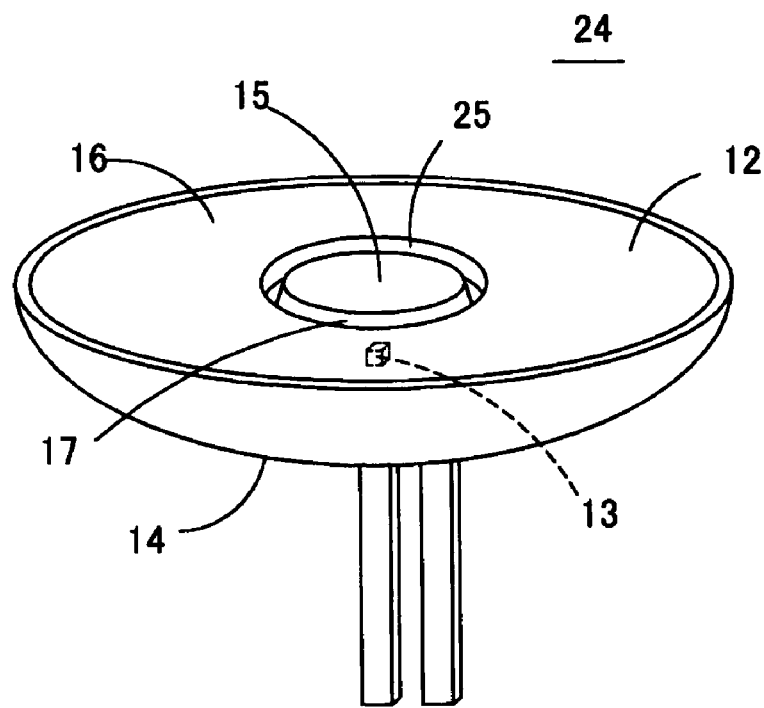
FIG. 10 shows a perspective view of a structure of a light emitting device according to still another embodiment of the present invention.
Figure 11B:
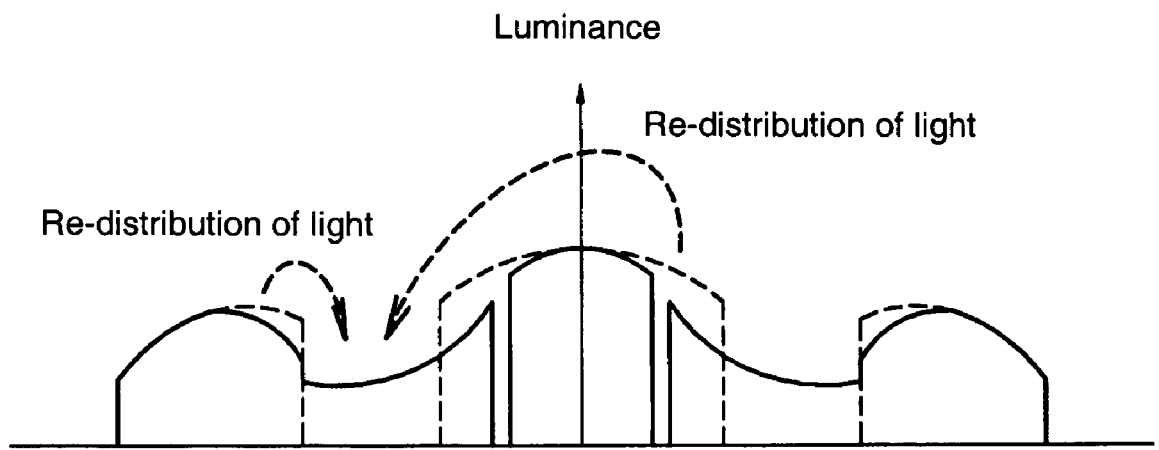
FIG. 11A shows a sectional view of the above light emitting device and FIG. 11B shows a graph of luminance distribution at a front face of the light emitting device.
Figure 11A:
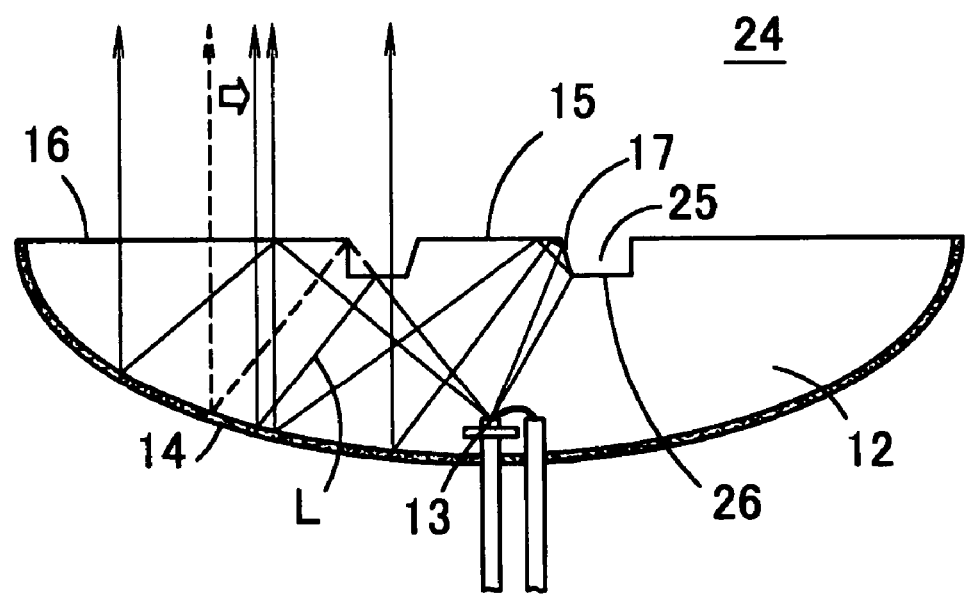
Figure 12A:
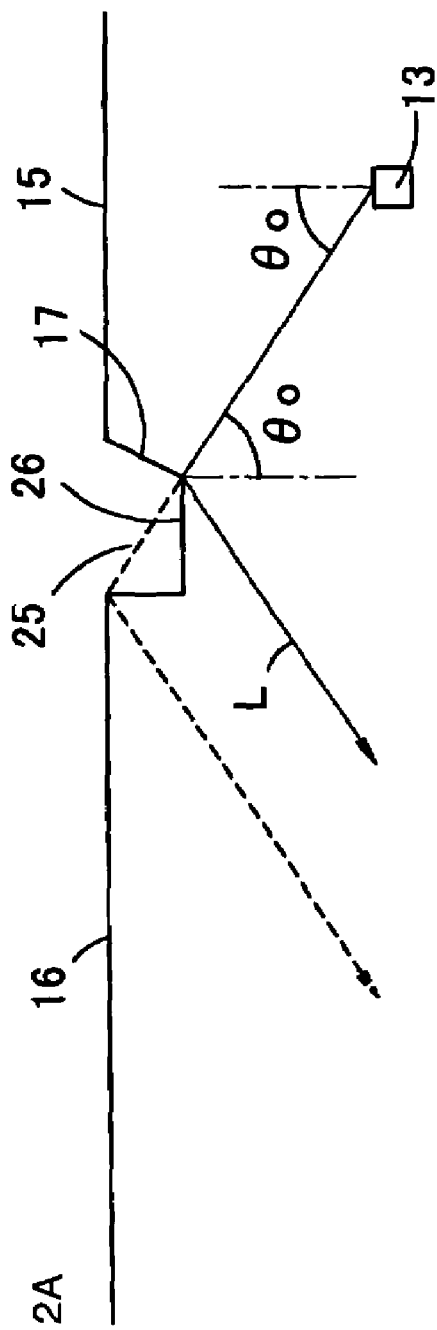
FIG. 12A shows a view for explaining a position of a groove in the above light emitting device and FIG. 12B shows an explanatory view for finding a sifted amount of light beam when it is totally reflected by the total reflection face of the bottom of the groove.

FIG. 10 is a perspective view showing a structure of a light emitting device 24 according to still another embodiment of the present invention, FIG. 11A is a sectional view thereof and FIG. 11B is a graph showing luminance distribution at the front face of the light emitting device 24. According to the light emitting device 24, a ring-shaped groove 25 is formed between a circular and flat direct emitting portion 15 and a flat total reflecting portion 16 formed around it, a total reflection face (third total reflecting portion) 26 is formed on a bottom face of a groove 25 and a slanted total reflecting portion 17 is formed by slanting its inner peripheral sidewall face. In the illustrated example, the direct emitting portion 15 and the total reflecting portion 16 are formed on the same plane and the direct emitting portion 15 is positioned at the same height as that of the total reflecting portion 16. However, it does not matter even if the direct emitting portion 15 projects from the groove 25 so as to be positioned higher than the total reflecting portion 16. In addition, although the groove 25 may be provided between the direct emitting portion 15 and the total reflecting portion 16, it is desirable that the groove 25 is positioned such that the light emitted from the light emitting element 13 at the same angle as the critical angle $\theta 0$ of total reflection reaches the inner peripheral edge of the total reflection face 26 as shown in FIG. 12A.

Thus, according to the light emitting device 24, as shown in FIGS. 11A and 11B, the incident light on the slanted total reflecting portion 17 positioned at the outer periphery of the direct emitting portion 15 is reflected by the slanted total reflecting portion 17 and the direct emitting portion 15 two times, and emitted forward from a reflecting member 14 toward a dark part in which neither the direct light from the direct emitting portion 15 nor the light reflected by the total reflecting portion 16 and the reflecting member 14 two times does not reach. This is the same effect as in the first embodiment.

Furthermore, according to the light emitting device 24, the light which would be totally reflected by the total reflecting portion 16 and impinge on the reflecting member 14 if the groove 25 was not provided, like the light L shown by a dotted line in FIG. 11A is totally reflected by the total reflection face 26 and shifted to the side of the light emitting element 13. As a result, as shown in FIG. 11B, the light which was emitted from a region adjacent to the dark part before the groove 25 is provided is emitted from a position shifted into the dark part because of the groove 25, whereby light luminance emitted from the light emitting device 24 can be further uniformed.

Figure 12B:
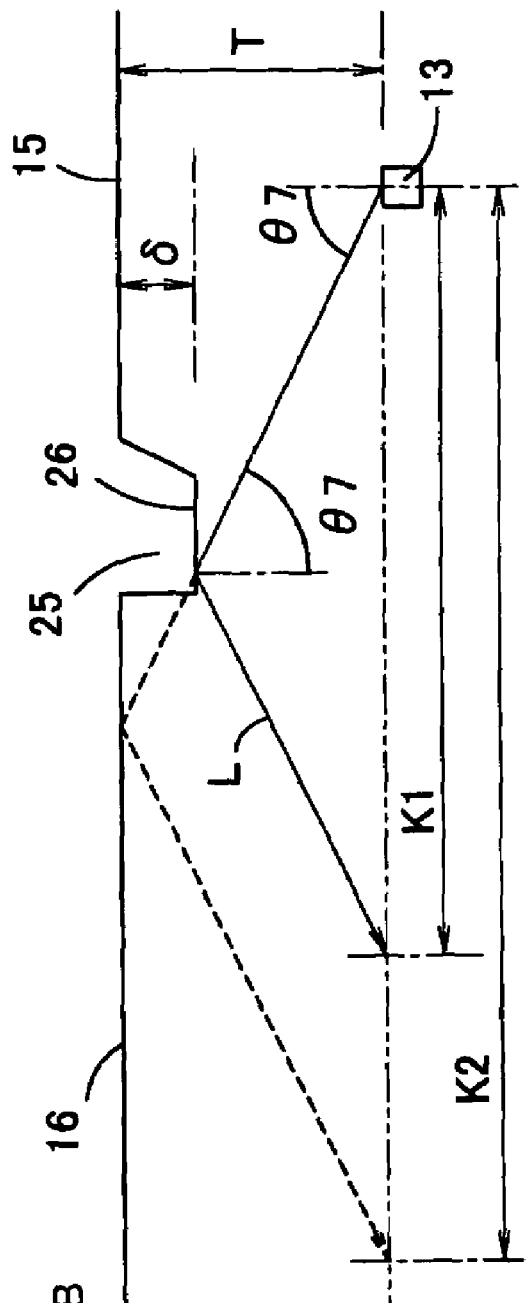

FIG. 12B is a view showing a relation between a depth $\delta$ of the groove 25 and an amount of shift of the light. Assuming that the depth of the groove 25 measured from the total reflecting portion 16 is $\delta$ and the depth of the inserted position of the light emitting element 13 measured from the total reflecting portion 16 perpendicularly is T, the light L emitted from the light emitting element 13 at the emission angle $\theta 7$ ($\geqq \theta$) is to be considered. In the case where the groove 25 does not exist, when it is assumed that a distance between a position in which the light L totally reflected by the total reflecting portion 16 reaches the horizontal surface on which the light emitting element 13 is provided, and the light emitting element 13 is K2, that is expressed as follows.

$$K2 = 2T \tan \theta 7 \quad (19)$$

In addition, when it is assumed that a distance between a position in which the light L totally reflected by the total reflection face 26 positioned at the bottom of the groove 25 reaches the horizontal surface on which the light emitting element 13 is provided and the light emitting element 13 is K1, that is expressed as follows.

$$K1 = 2(T-\delta)\tan\theta 7 \quad (20)$$

Accordingly, the shifted amount K2−K1 is as follows using the equations (19) and (20).

$$K2 - K1 = 2\delta \tan\theta 7 \quad (21)$$

Thus, it can be understood that the emitting position of the light L can be controlled by adjusting the shifted amount D2−D1 of the light totally reflected by the total reflection face 26 by adjusting the depth δ of the groove 25.

(Fourth Embodiment)

Figure 13A:
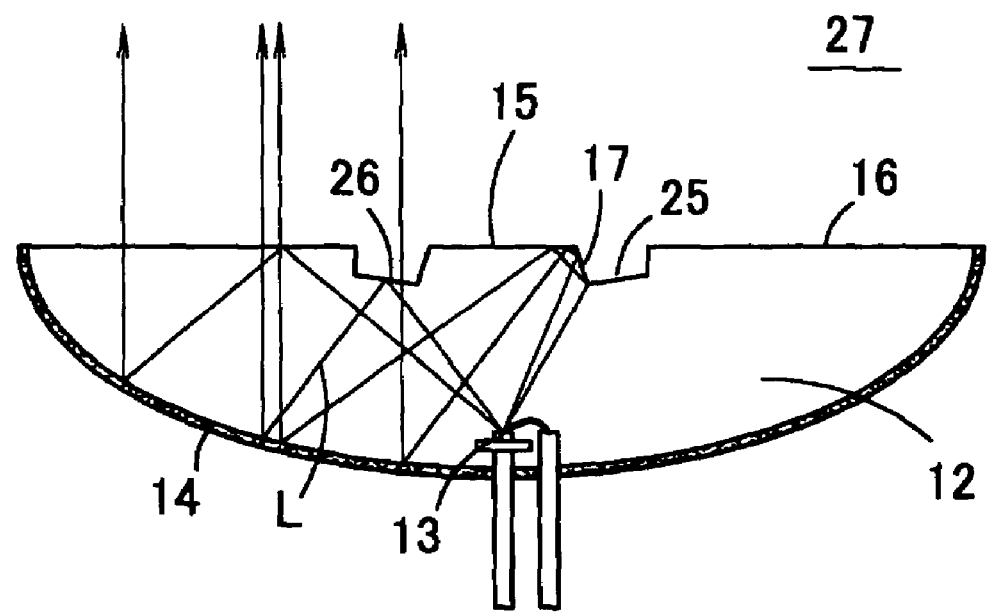
FIG. 13A shows a sectional view of a structure of a light emitting device according to still another embodiment of the present invention and FIG. 13B shows an enlarged sectional view of a vicinity of a groove.
Figure 13B:
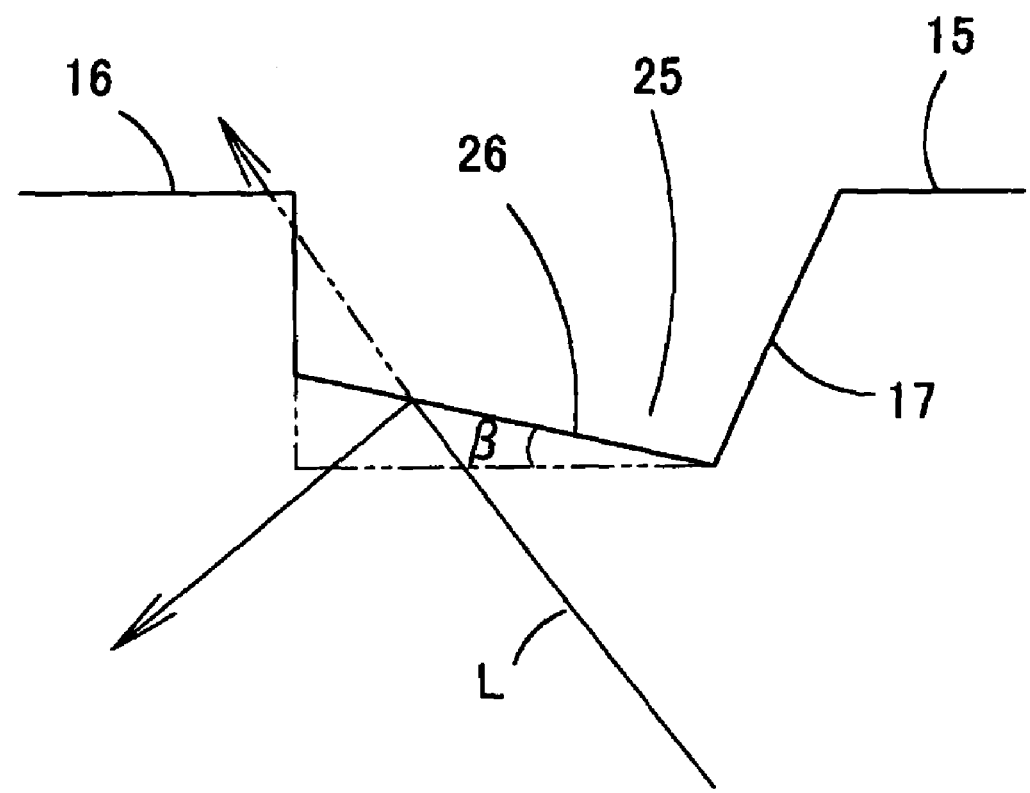

FIG. 13A is a sectional view showing a structure of a light emitting device 27 according to still another embodiment of the present invention, and FIG. 13B is an enlarged sectional view showing a vicinity of a groove 25. According to the light emitting device 27, as shown in FIG. 13B, a total reflection face 26 provided at the bottom of the groove 25 is inclined by β as compared with the light emitting device 24 shown in FIG. 10. When the bottom of the total reflection face 26 is inclined, since the light emitted from a light emitting element 13 at the emission angle smaller than the critical angle θ0 of total reflection can be also totally reflected by the total reflection face 26 to be sent to the dark part, the amount of light to be sent to the dark part can be increased by widening the width of the groove 25, whereby the luminance can be further uniformed. Alternatively, since the light emitted from the edge of a direct emitting portion 15 at a large angle in the slanted direction can be sent to the dark part by moving the position of the groove 25 to the side of the direct emitting portion 15, usability of the light can be improved. Furthermore, since the inclination β of the total reflection face 26 can be a designing parameter, a behavior (light path) of the light beam can be easily controlled.

Figure 14:
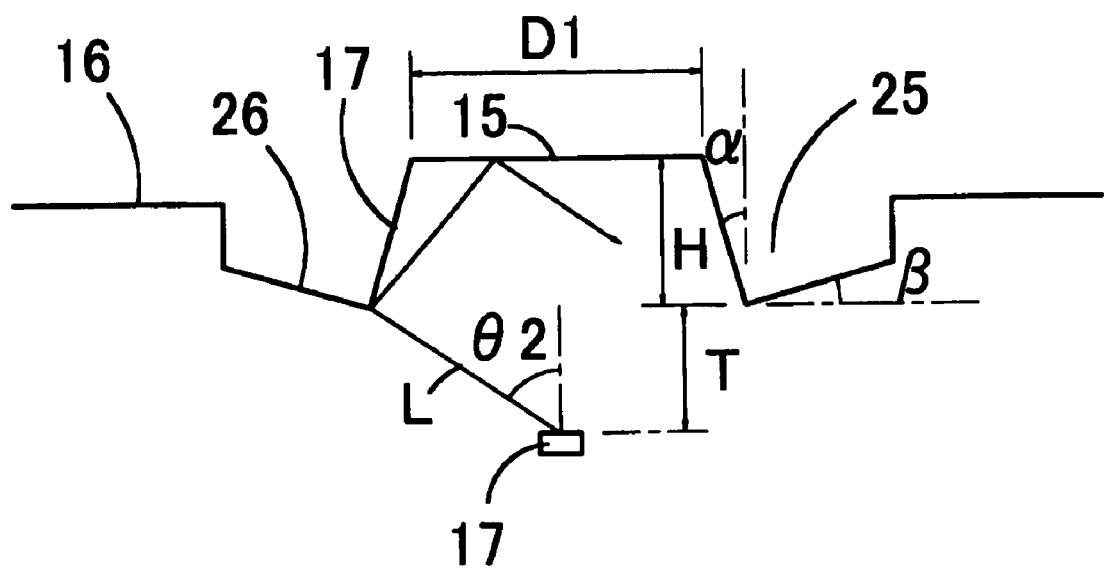
FIG. 14 shows a view for finding a condition to determine an optical arrangement of a slanted total reflecting portion, total reflection face or the like in the above light emitting device.

FIG. 14 is a reference view for finding a condition for deciding an optical position of a slanted total reflecting portion 17, the total reflection face 26 or the like. As shown in FIG. 14, it is assumed that an outer diameter of the direct emitting portion 15 is D1, a height from the lower end to the upper end of the slanted total reflecting portion 17 in the vertical direction is H, a depth of the inserted position of the light emitting element 13 measured from the lower end of the slanted total reflecting portion 17 in the vertical direction is T, and an inclination of the slanted total reflecting portion 17 in the section in which a shaft center of a mold part 12 penetrates is α. In addition, although the height H of the slanted total reflecting portion 17 is larger than the depth δ of the groove 25 for generalization in FIG. 14, since the direct emitting portion 15 and the total reflecting portion 16 are formed on the same plane in the illustrated example in FIG. 13, in this case the height H of the slanted total reflecting portion 17 is equal to the depth δ of the groove 25.

When T, H, α or the like is defined as described above and it is assumed that the emission angle of the light emitted from the light emitting element 13 to the lower end of the slanted total reflecting portion 17 is θ2, the condition in which the light emitted from the light emitting element 13 is totally reflected by the slanted total reflecting portion 17 is as follows, 90°−θ2−α≧θ0 (θ0 is a critical angle of total reflection)

that is, like the equation (7) in the first embodiment, and $$D1 \leq 2T\cot(\alpha+\theta 0) - 2H\tan\alpha \quad (22)$$

is provided.

Furthermore, a condition in which the light totally reflected by the slanted total reflecting portion 17 is totally reflected by the direct emitting portion 15 is as follows like the equations (13) and (15) in the first embodiment.

$$D1 \geq 2(H+T)\tan(\theta 0 - 2\alpha) \quad (23)$$

$$D1 \geq 2H[\tan(\theta 2 + 2\alpha) - \tan\alpha] \quad (24)$$

Moreover, since the incident angle of the light on the end of the inner periphery of the total reflection face 26 is θ2+β, as the condition in which the incident light on the total reflection face 26 is totally reflected by the total reflection face 26, it follows that θ2+β is the critical angle θ0 of total reflection or more, that is, $$\beta \geq \theta 0 - \theta 2 \quad (25)$$

(Fifth Embodiment)

Figure 15:
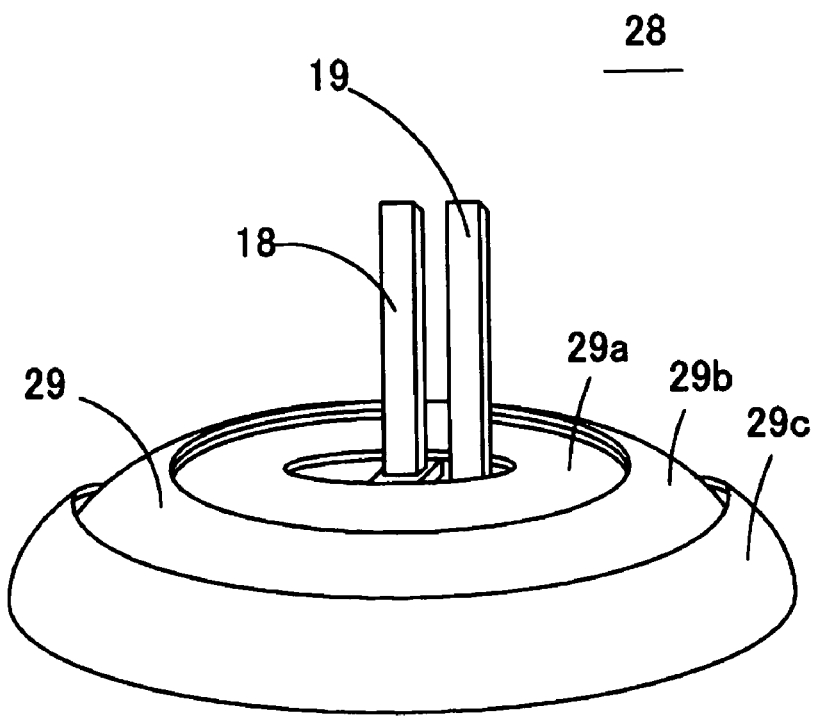
FIG. 15 shows a perspective view of alight emitting device viewed from a back face according to still another embodiment of the present invention.
Figure 16:
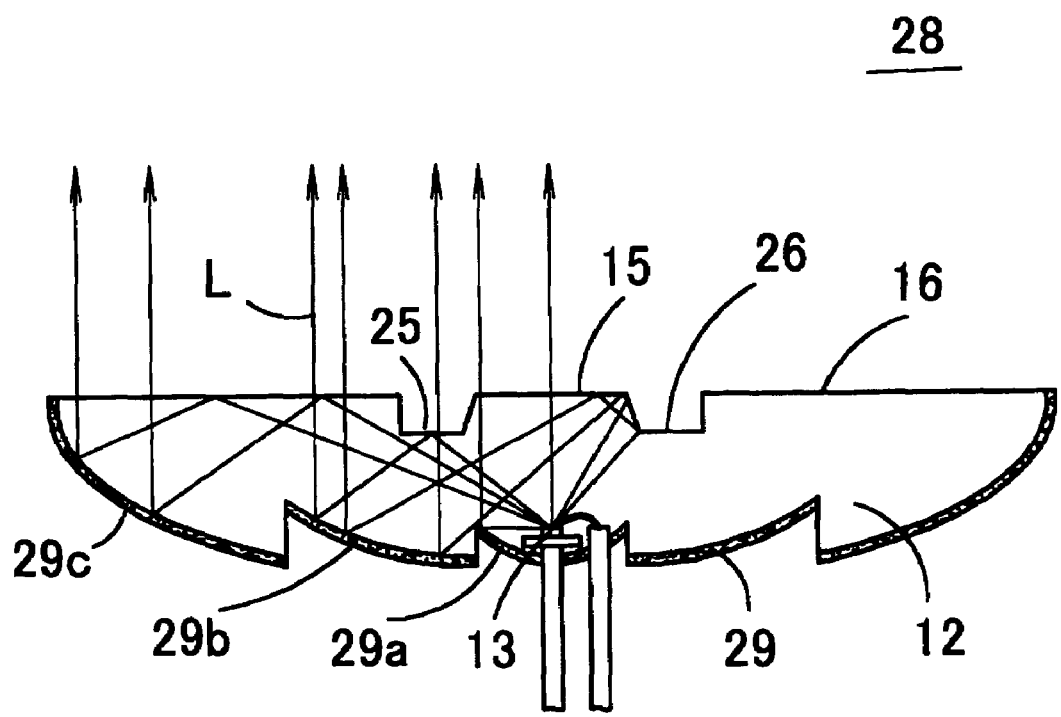
FIG. 16 shows a sectional view of the above light emitting device.

FIG. 15 is a perspective view showing a light emitting device 28 viewed from the back face according to still another embodiment of the present invention, and FIG. 16 is a sectional view thereof. According to the light emitting device 28, a reflecting member 29 formed on a back face of a mold part 12 consists of a plurality of ring-shaped reflecting portions 29a, 29b, ..., which form Fresnel reflection face. When the reflecting member 29 is formed in the shape of the Fresnel reflection face, the light emitting device 28 can be further thinned. Besides, each region can be designed optimally by designing each of the plural reflecting portions 29a, 29b, ... with a independent parameter to each other, thereby to be able to emit the light more uniformly.

(Sixth Embodiment)

Figure 17:
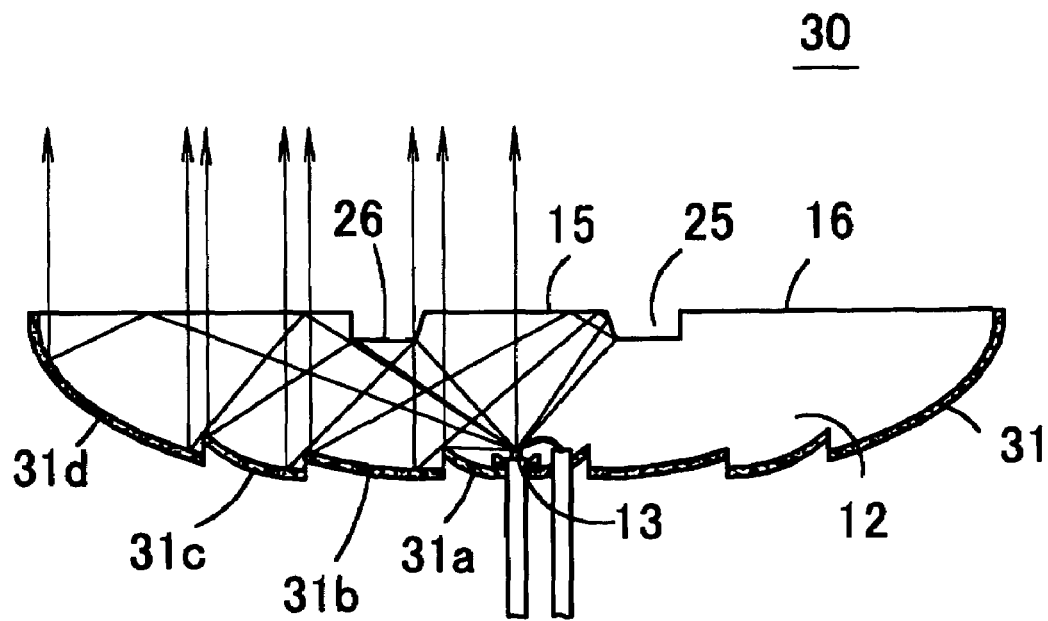
FIG. 17 shows a sectional view of a light emitting device according to still another embodiment of the present invention.

FIG. 17 is a sectional view showing a light emitting device 30 according to still another embodiment of the present invention. Referring to the light emitting device 30, a groove 25 is formed between a direct emitting portion 15 and a total reflecting portion 16 at a front face of a mold part 12, and a total reflection face 26 is formed on the bottom of the groove 25. A reflecting member 31 formed on the back face of the mold part 12 consists of four ring-shaped reflecting portions 31a, 31b, 31c and 31d, which form Fresnel reflection face. In this constitution, the reflecting portion 31d is configured and positioned so as to receive the light which was emitted from a light emitting element 13 and totally reflected by the total reflecting portion 16 and to emit forward from the total reflecting portion 16. The reflecting portion 31c is configured and positioned so as to receive the light which was emitted from the light emitting element 13 and totally reflected by the total reflection face 26 and to emit forward from the total reflecting portion 16. The reflecting portion 31b is configured and positioned so as to receive the light which was emitted from the light emitting element 13 and totally reflected by a slanted total reflecting portion 17 and the direct emitting portion 15 and to emit forward from the front face of the mold part 12. The reflecting portion 31a is configured and positioned so as to receive the light which was emitted from the light emitting element 13 at a large emission angle to impinge directly on the reflection face 31 and to emit forward from the front face of the mold part 12.

According to this embodiment, since the reflecting portions 31a, 31b, 31c and 31d are provided depending on the characteristics of the light path of the incident light and each of the reflecting portions 31a, 31b, 31c and 31d can be designed depending on each characteristic, light can be further uniformly emitted from a light source apparatus.

(Seventh Embodiment)

Figure 18:
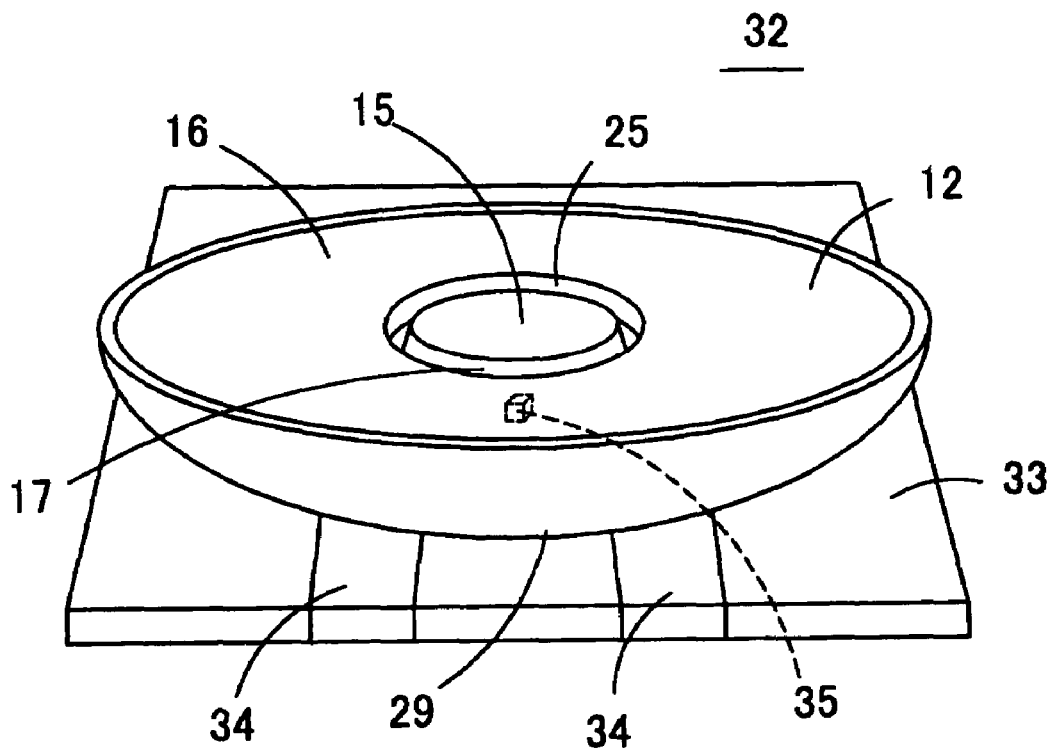
FIG. 18 shows a perspective view of a light emitting device according to still another embodiment of the present invention.
Figure 19:
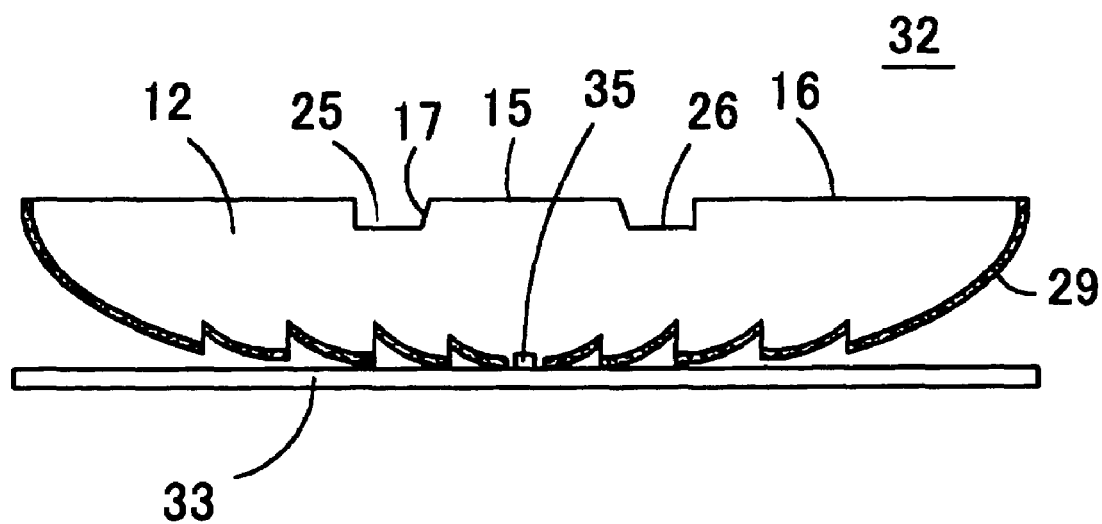
FIG. 19 shows a sectional view of the above light emitting device.

FIG. 18 is a perspective view showing a light emitting device 32 according to still another embodiment of the present invention, and FIG. 19 is a sectional view thereof. The light emitting device 32 is a surface mounted type in which a lead terminal is not provided. A mold part 12 provided with a reflecting member 29 on its back face is mounted on a support substrate 33. The support substrate 33 serves as a heat sink also and it is a metal board having high thermal conductivity or a ceramic board such as alumina. A pair of strip-shaped electrode films 34 is provided from the front to the back faces (when the support substrate 33 is made of metal, through an insulating layer) on the support substrate 33. A light emitting element 35 in which a light emitting element such as an LED chip is molded with resin is mounted on the support substrate 33 and the electrode films 34 are electrically connected to the light emitting element 35. A concave portion is provided at a central lower face of the mold part 12 fixed on an upper face of the support substrate 33 and the light emitting element 35 provided on the upper face of the support substrate 33 is housed in the concave portion.

Although a groove 25 is formed between a direct emitting portion 15 and a total reflecting portion 16 in the illustrated example shown in FIGS. 18 and 19, the direct emitting portion 15 and a slanted total reflecting portion 17 in the shape of the truncated cone may project from the total reflecting portion 16 like in the first embodiment. In addition, although a reflecting member 29 is in the shape of Fresnel reflection face, a reflecting member 14 in the shape of the smooth face like in the first embodiment may be used.

According to this embodiment, since the light emitting element 35 and the mold part 12 are mounted on the support substrate 33 without using a lead terminal as a surface mounted type, the light emitting device 32 can be significantly thinned. Furthermore, since the support substrate 33 has a heat-release function, the light emitting device 32 is provided with a large heat sink. As a result, there can be provided the large and bright light emitting device 32 by using the high-power light emitting element 35 or mounting a plurality of light emitting elements 35.

(Eighth Embodiment)

Figure 20:
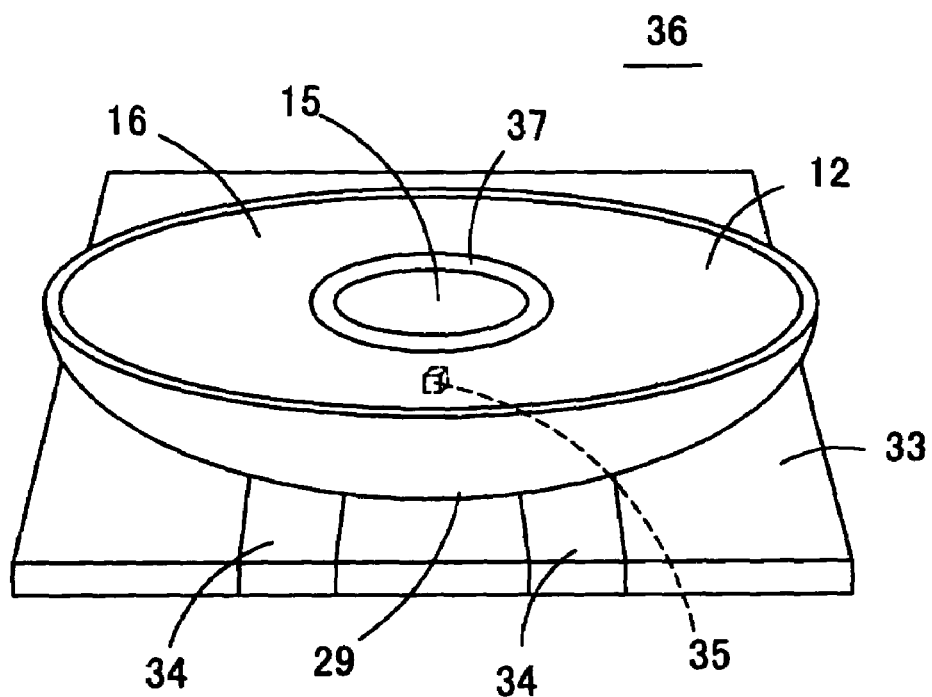
FIG. 20 shows a perspective view of a light emitting device according to still another embodiment of the present invention.
Figure 21:
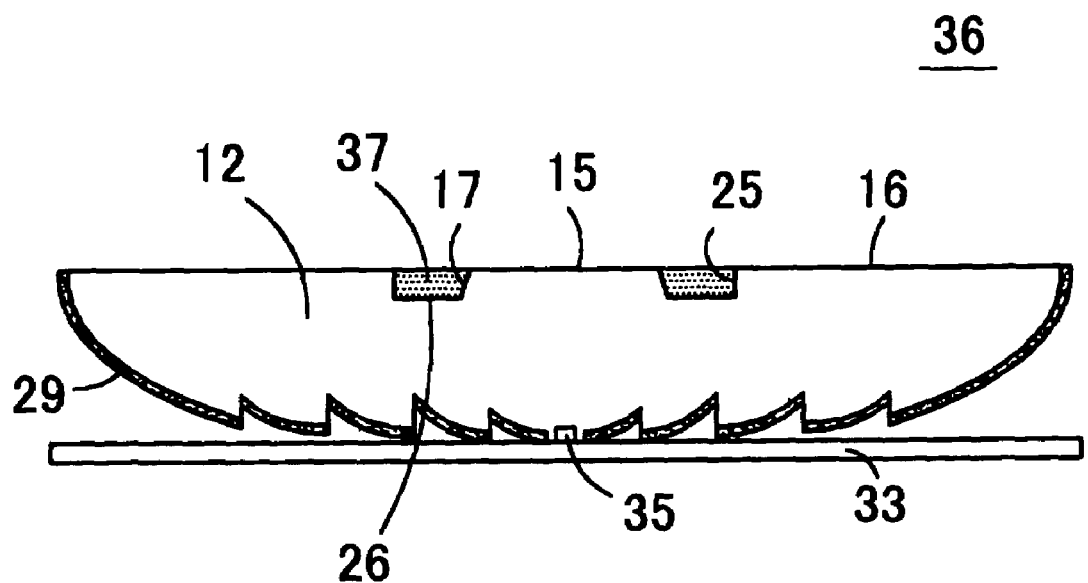
FIG. 21 shows a sectional view of the above light emitting device.

FIG. 20 is a perspective view showing a light emitting device 36 according to still another embodiment of the present invention, and FIG. 21 is a sectional view thereof. According to the light emitting device 36, a ring-shaped groove 25 provided in a front face of a mold part 12 is filled with a filling part 37 formed of a light transmitting material having a refractive index lower than the mold part 12 such as a transparent resin, so that the front face of the mold part 12 becomes a flat surface. When the groove 25 is provided in the front face of the mold part 12, dirt and/or dust could be piled up in the groove 25 and the luminance at that part is lowered and get dark or directional characteristics could be lowered due to scattering of them. According to this embodiment, however, the groove 25 is filled with the filling part 37, so that the dirt and/or dust is prevented from being piled up in the groove 25. As a result, the luminance of the light emitting device 36 is prevented from being lowered partially and getting dark due to the dirt and/or dust and the directional characteristics are prevented from being lowered.

(Ninth Embodiment)

Figure 22:
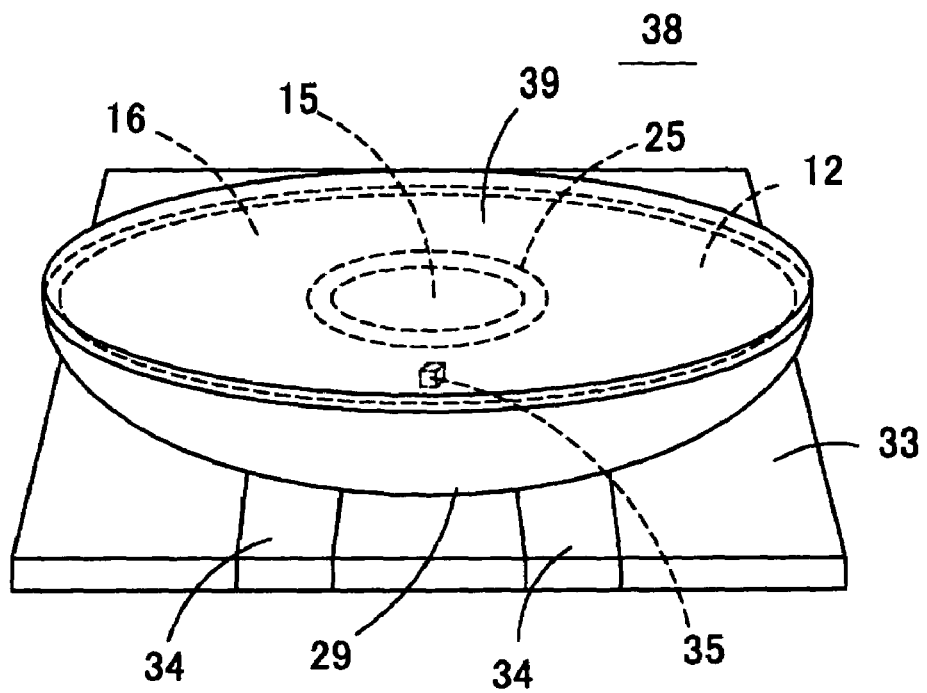
FIG. 22 shows a perspective view of a light emitting device according to still another embodiment of the present invention.
Figure 23:
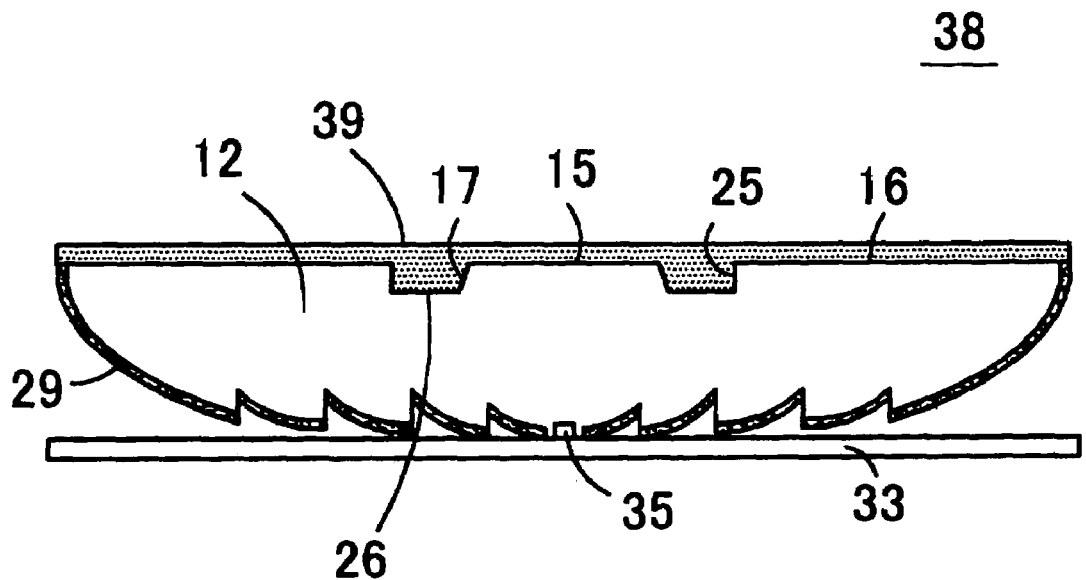
FIG. 23 shows a sectional view of the above light emitting device.

FIG. 22 is a perspective view showing a light emitting device 38 according to still another embodiment of the present invention, and FIG. 23 is a sectional view thereof. According to the light emitting device 38, the whole of a front face of a mold part 12 is coated with a coating part 39 formed of a light transmitting material having a lower refractive index such as a transparent resin, and at the same time, a ring-shaped groove 25 is filled with the coating part 39. According to this embodiment, since the front face of the mold part 12 is covered with the coating part 39, when a material having hardness higher than the mold part 12 is used as the material of the coating part 39, the mold part 12 is protected and can be prevented from being damaged. In addition, since the groove 25 is filled with the coating part 39, the dirt and/or dust is prevented from being piled up in the groove 25. As a result, the luminance of the light emitting device 38 is prevented from being lowered partially and getting dark and the directional characteristics are prevented from being lowered.

(Tenth Embodiment)

Figure 24A:
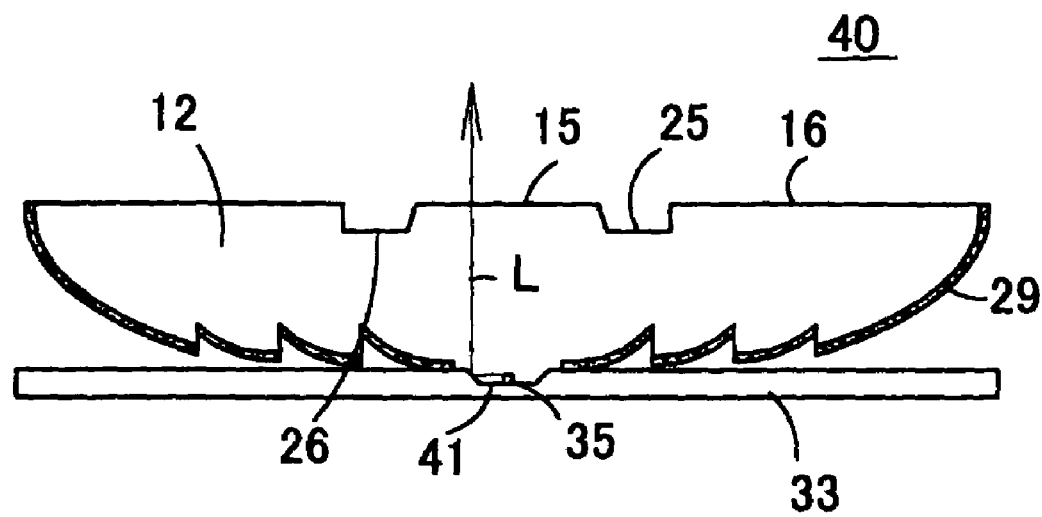
FIG. 24A shows a sectional view of a light emitting device according to still another embodiment of the present invention and FIG. 24B shows a partially enlarged sectional view thereof.
Figure 24B:
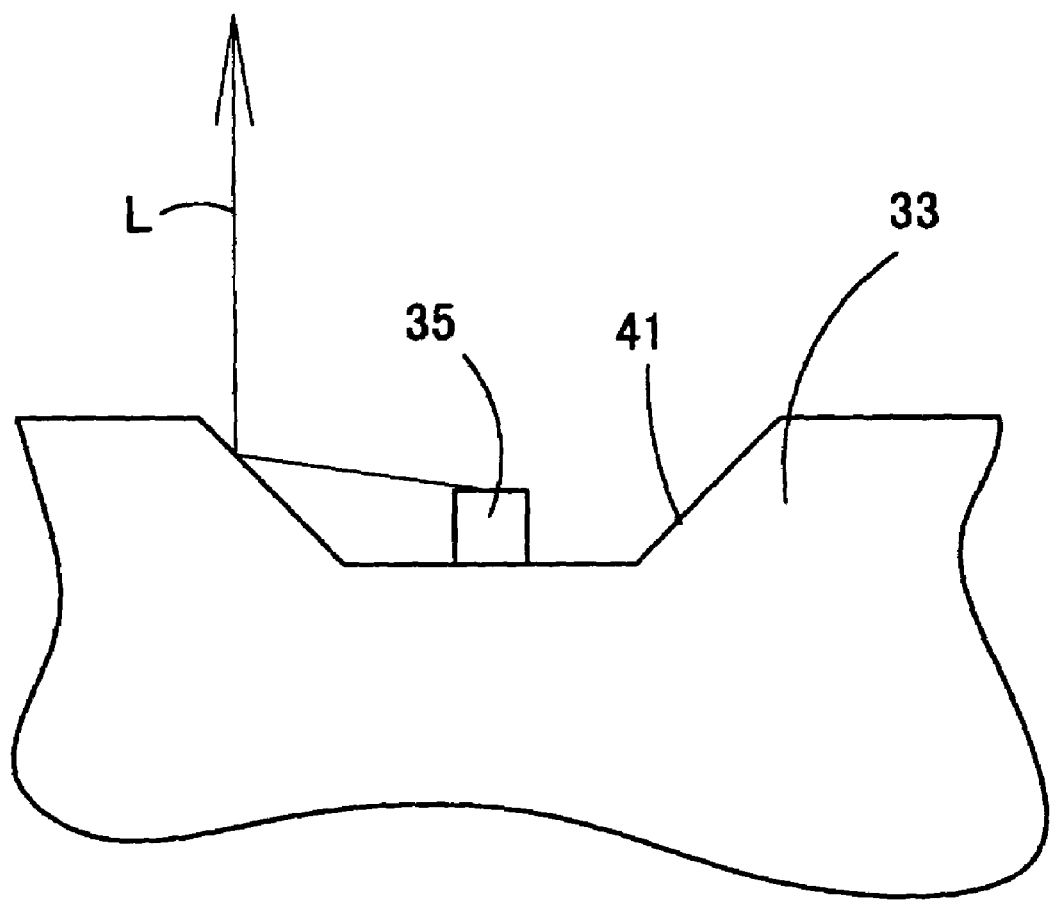

FIG. 24A is a sectional view showing a light emitting device 40 according to still another embodiment of the present invention, and FIG. 24B is a partially enlarged sectional view thereof. According to this embodiment, a concave portion 41 in the shape of a taper or a parabola is provided in an upper face of a support substrate 33 and the surface of the concave portion 41 is mirror finished or mirror processed. A light emitting element 35 is mounted on the center of the concave portion 41. According to the thus structured light emitting device 40, the light emitted from the light emitting element 35 at a large emission angle is reflected by an outer peripheral face of the concave portion 41, deflected forward and emitted forward through a direct emitting portion 15. According to this embodiment, since the light emitted from the light emitting element 35 at the large emission angle can be controlled by the concave portion 41 provided in the support substrate 33, usability of light can be improved and the degree of freedom in design can be also improved.

(Eleventh Embodiment)

Figure 25A:
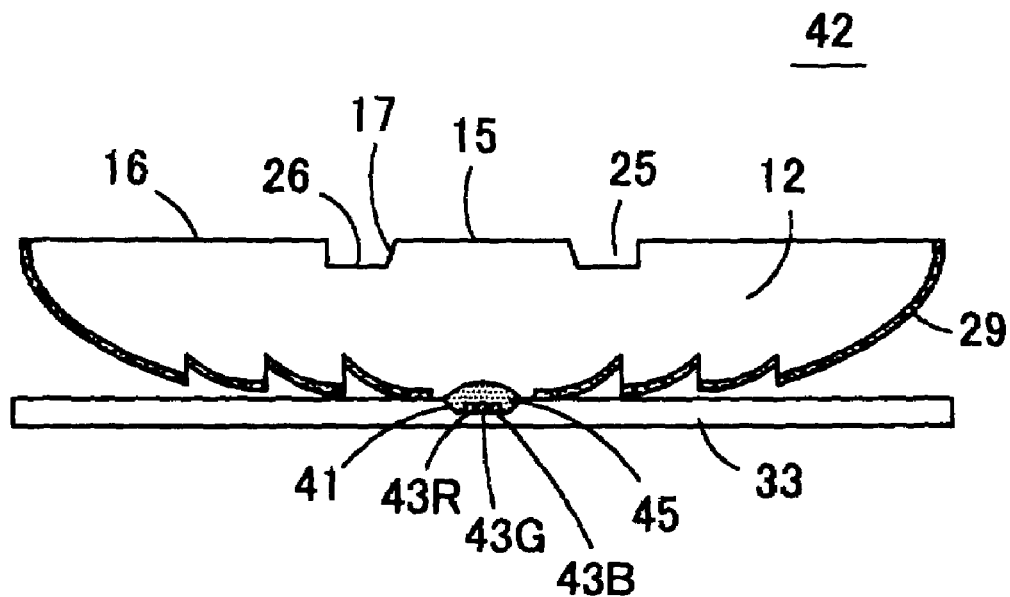
FIG. 25A shows a sectional view of a light emitting device according to still another embodiment of the present invention and FIG. 25B shows a partially enlarged sectional view thereof.
Figure 25B:
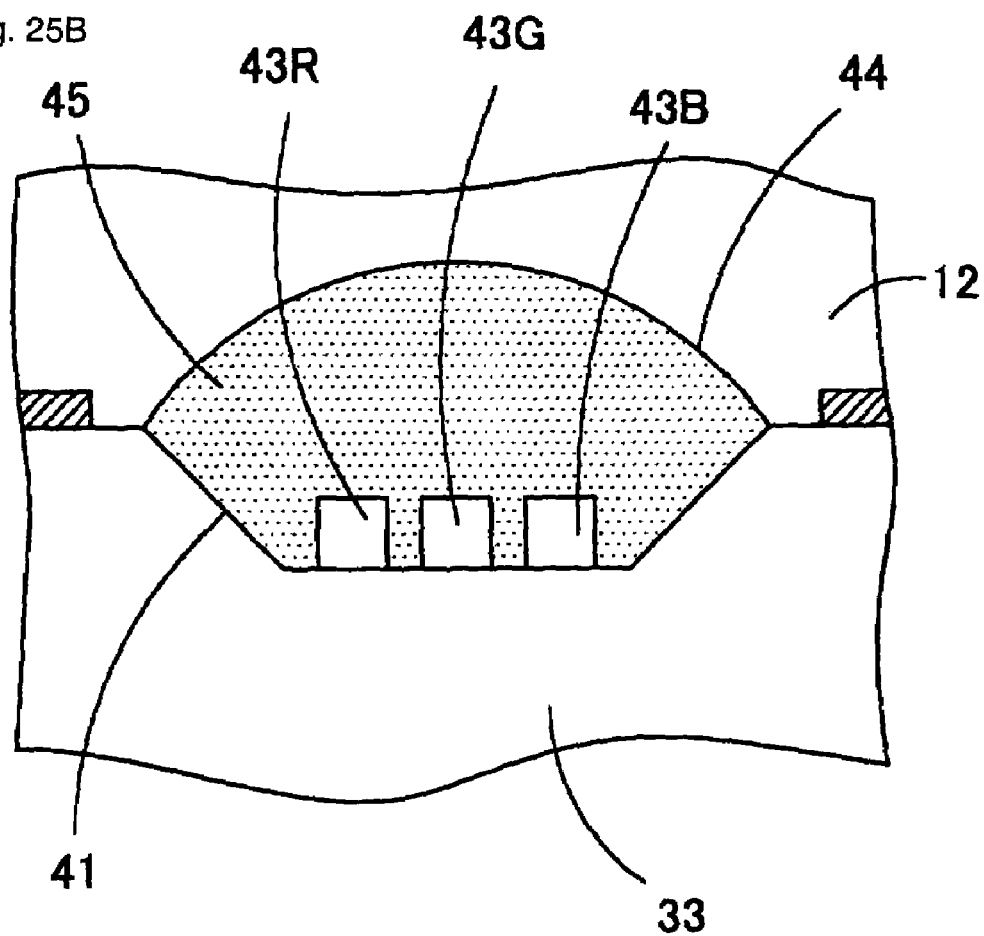

FIG. 25A is a sectional view showing a light emitting device 42 according to still another embodiment of the present invention, and FIG. 25B is a partially enlarged sectional view thereof. According to this embodiment, at least each of a light emitting element 43R such as a red LED, a light emitting element 43G such as a green LED, and a light emitting element 43B such as a blue LED are provided in a concave portion 41 provided in an upper face of a support substrate 33, and a light transmitting material 45 in which light diffusing elements such as fine metal powder or metal filament is dispersed is filled in a space between a concave portion 44 and the concave portion 41 provided at the center of a lower face of a mold part 12.

According to the light emitting device 42, when the red light emitting element 43R, the green light emitting element 43G and the blue light emitting element 43B emit light at the same level of power, for example, red light, green light and blue light emitted from the light emitting elements 43R, 43G and 43B, respectively are scattered by the diffusion agent in the light transmitting material 45 and mixed with each other to become white light, and then the light emitting device 42 emits the white light. In addition, when only the red light emitting element 43R emits light, the light emitting device 42 emits the red light. Thus, according to the light emitting device 42, full-color display can be implemented by selecting the light emitting elements 43R, 43G and 43B to emit light and varying each power. In addition, when the light emitting elements having different colors emit light, since the colors can be effectively mixed by the diffusion agent, they can be regarded as one light emitting element. Furthermore, according to the light emitting device 42, the surface of the light transmitting material 45 (interface with the concave portion 44) can be regarded as a light emitting surface. In addition, according to the light emitting device 42, since the support substrate 33 having a heat release function is used, powers of the light emitting elements 43R, 43G and 43B can be gained. Still further, although description was made of the case where the red, green and blue light emitting elements are mounted in this embodiment, even when a plurality of the same color light emitting elements are mounted, it seems that light is emitted from one light emitting element. As a result, there can be provided the light emitting device 42 having high luminance. Besides, since the light emitting device 42 can be designed such that the plural light emitting elements are regarded as one light emitting element, the designing the light emitting device 42 is very simple.

(Twelfth Embodiment)

Figure 26A:
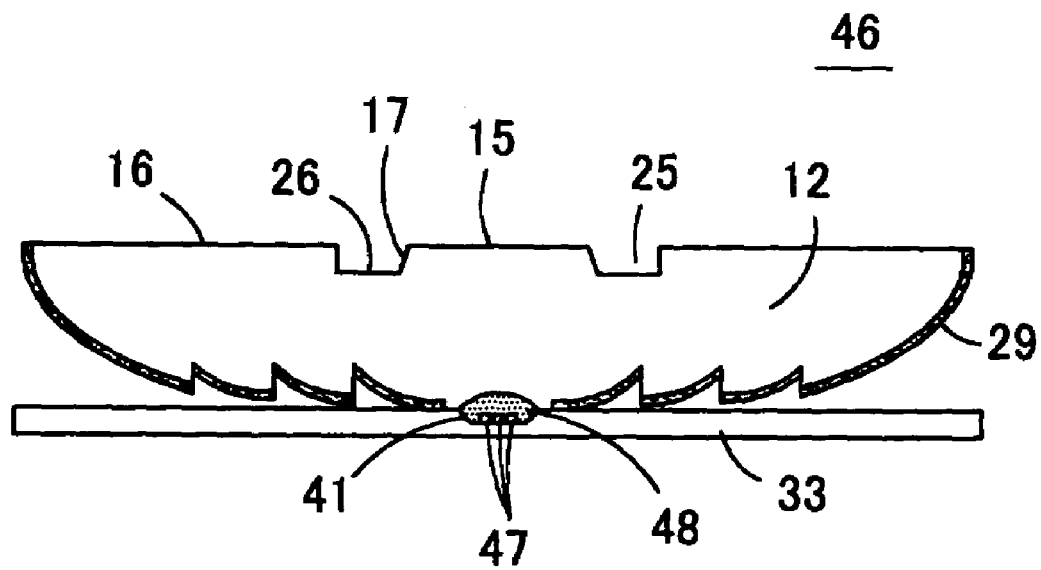
FIG. 26A shows a sectional view of a light emitting device according to still another embodiment of the present invention and FIG. 26B shows a partially enlarged sectional view thereof.
Figure 26B:
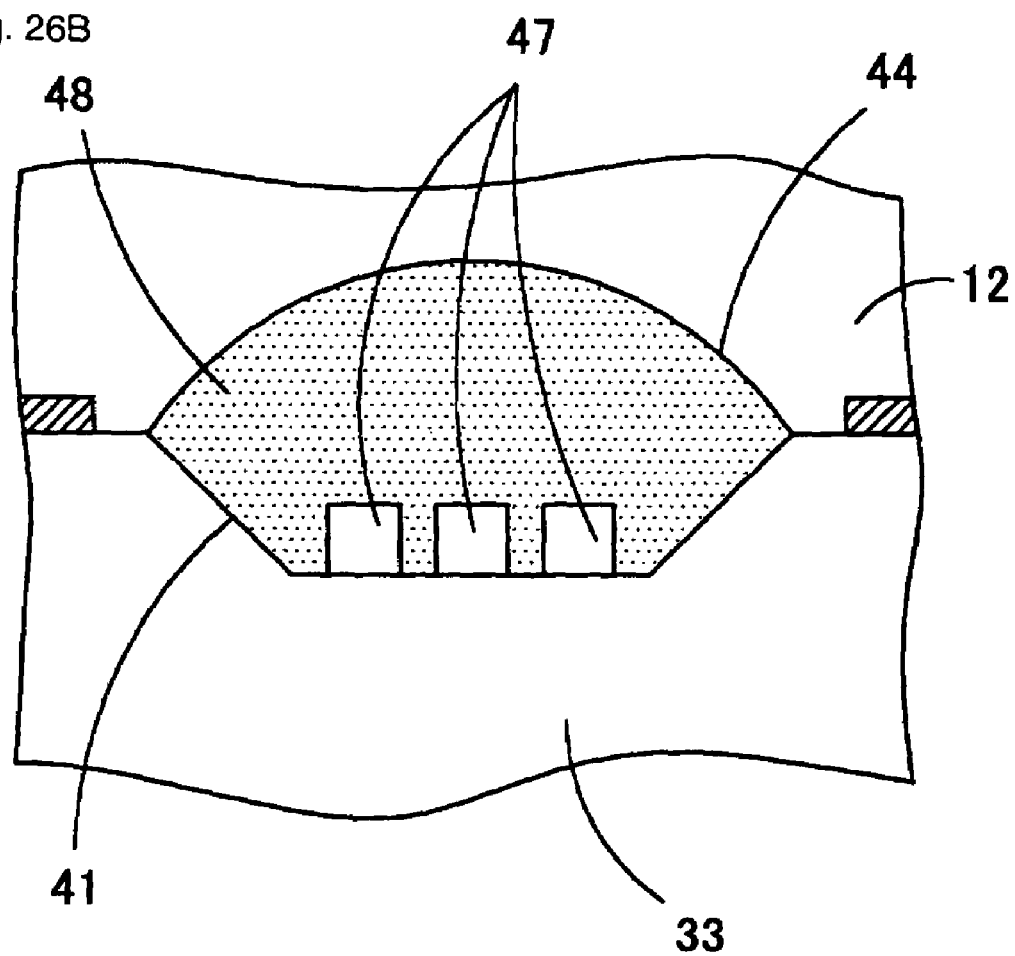

FIG. 26A is a sectional view showing a light emitting device 46 according to still another embodiment of the present invention, and FIG. 26B is a partially enlarged sectional view thereof. According to this embodiment, one light emitting element or more light emitting elements 47 each emitting blue light are mounted in a concave portion 41 provided in an upper face of the support substrate 33, and a light transmitting material 48 in which phosphors are dispersed is filled in a space between a concave portion 44 and the concave portion 41 provided at the center of a lower surface of a mold part 12.

According to the light emitting device 46, when the light emitting element 47 emits light, the phosphors in the light transmitting material 48 emits light by blue light emitted from the light emitting element 47 and the light transmitting material 48 emits white light as a whole. Thus, even when the plural light emitting elements 47 are used, they can be regarded as one light emitting element, which makes the designing of the light emitting device 46 easy.

Meanwhile, a light emitting element emitting ultraviolet ray may be used as the light emitting element 47 and red phosphors, green phosphors and blue phosphors may be uniformly dispersed in the light transmitting material 48. In this structure also, since the red phosphors, green phosphors and blue phosphors emit light by the ultraviolet ray emitted from the light emitting element 47, white light can be emitted from the light emitting device 46.

(Thirteenth Embodiment)

FIG. 27 are views showing various front configurations of light emitting devices according to the present invention. Although description was made of the light emitting device having the front configuration of a circle (that is, a perfect circle, an ellipse or the like) in the above embodiments, the front configuration of the light emitting device is not limited to the circle. According to a light emitting device 49 shown in FIG. 27A, a light emitting element 49a is designed in the shape of the perfect circle shown by a dotted line and then, peripheral six portions are cut to be formed as a regular hexagon. According to a light emitting device 50 shown in FIG. 27B, a light emitting element 50a is designed in the shape of the perfect circle shown by a dotted line and then, peripheral four portions are cut to be formed as a regular tetragon. According to a light emitting device 51 shown in FIG. 27C, a light emitting element 51a is designed in the shape of the perfect circle shown by a dotted line and then, peripheral four portions are cut to be formed as a rectangle. According to a light emitting device 52 shown in FIG. 27D, a light emitting element 52a is designed in the shape of the perfect circle shown by a dotted line and then, peripheral four portions are cut to be formed as a rectangle. In addition, the peripheral portions are cut as an order in design and they are not cut in the real manufacturing process.

Figure 28A:
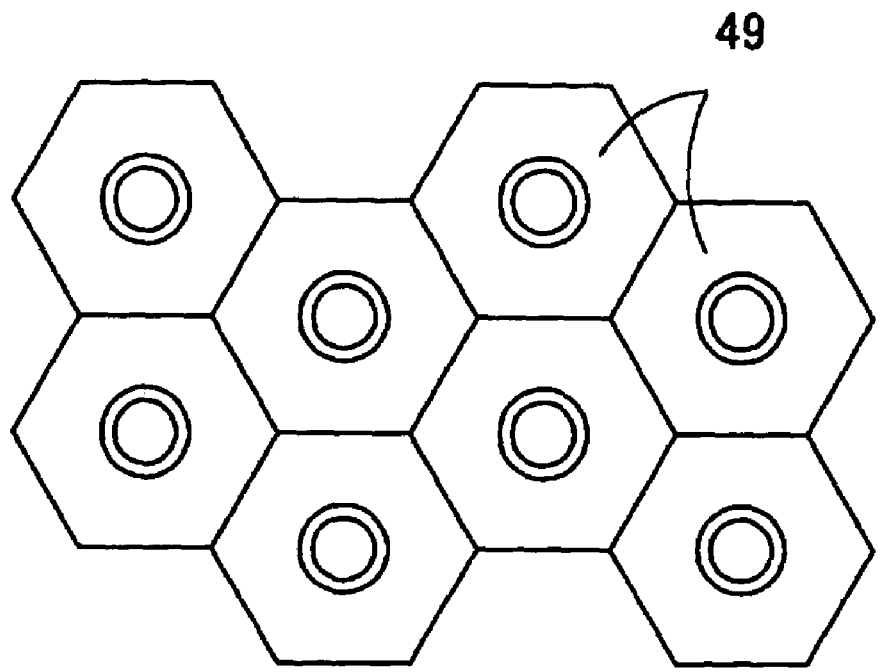
FIG. 28A shows a view of a case where hexagonal light emitting devices are arranged flatways leaving no space among them and FIG. 28B shows a view of a case where rectangular or square light emitting devices are arranged flatways leaving no space among them.
Figure 28B:
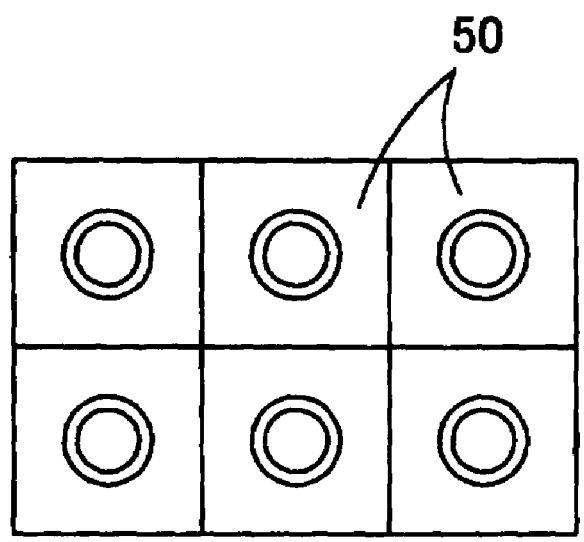
Figure 29A:
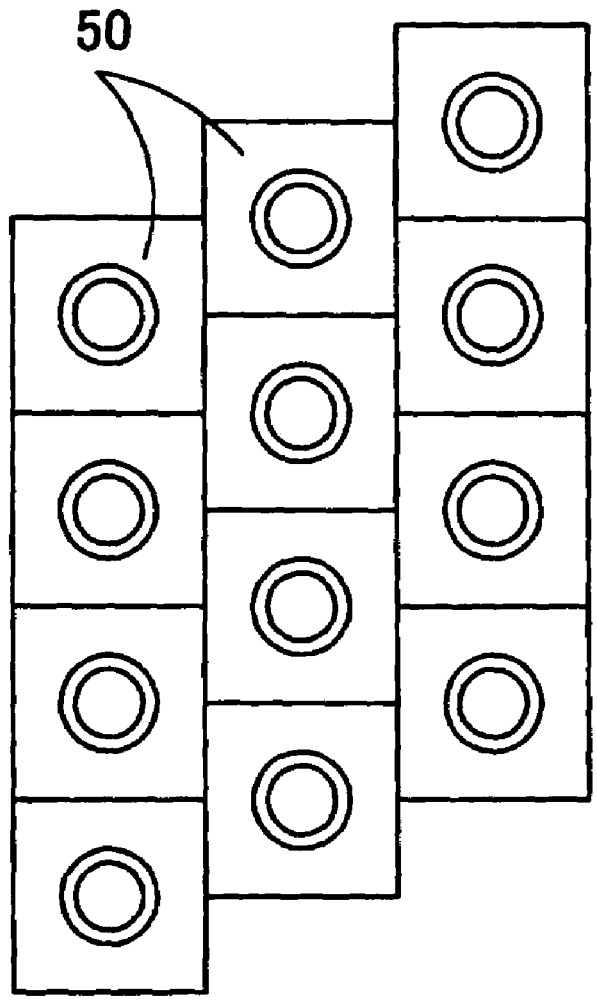
FIG. 29A shows a view of a case where rectangular or square light emitting devices are arranged flatways leaving no space among them and FIG. 29B shows a view of a case where square or rectangular light emitting devices are arranged in a line.
Figure 29B:
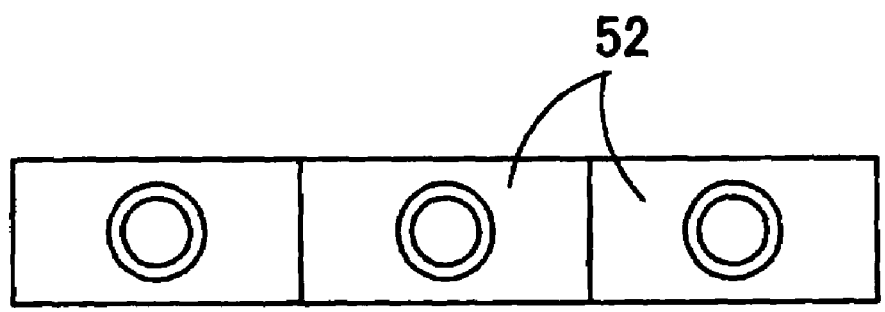

When these light emitting devices 49, 50, 51, 52 and the like are used and arranged linearly or arranged flatways, there is no space between the light emitting devices unlike the case of the circular light emitting devices, so that they can be arranged closely. For example, FIG. 28A shows a case where the hexagon light emitting devices 49 are arranged on the plane leaving no space among them. In addition, FIGS. 28B and 29B show cases where rectangular or square light emitting devices 50 are arranged on the plane leaving no space among them. According to the case shown in FIG. 28B, since the light emitting devices 50 are arranged vertically and horizontally in an orderly manner, corners (having the lowest luminance because they are positioned farthest from the center of the light emitting device 50) of the light emitting devices 50 are concentrated in one place and this place could be dark. However, according to the case shown in FIG. 29A, when the adjacent rows of the light emitting devices 50 are shifted by a half pitch, the corners are prevented from being concentrated in one place and partially getting dark can be alleviated. FIG. 29B shows a case where the square or rectangular light emitting devices 52 are arranged in a single horizontal row. Therefore, according to the arrangements shown in FIGS. 28A and 28B and FIG. 29A, a large surface light source can be provided and according to the arrangement shown in FIG. 29B, a long linear light source in one direction can be provided.

(Fourteenth Embodiment)

Figure 30A:
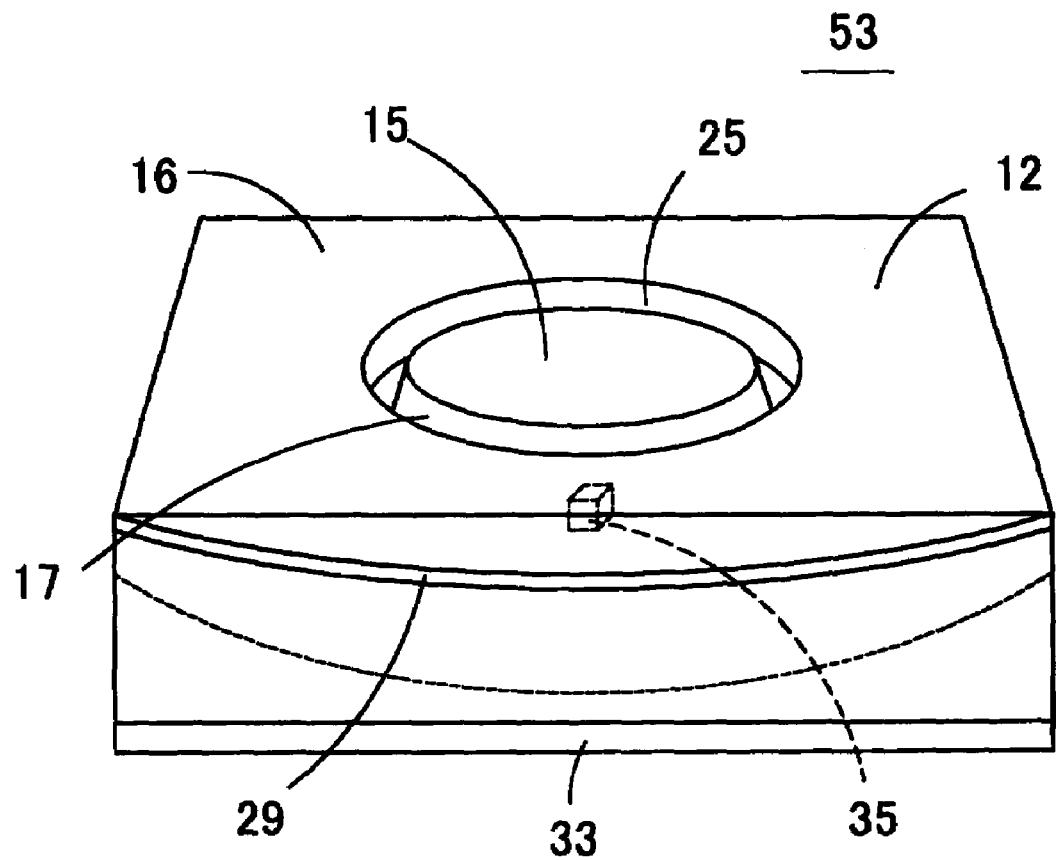
FIG. 30A shows a perspective view of a structure of a light emitting device according to still another embodiment of the present invention and FIG. 30B shows a sectional view thereof.
Figure 30B:
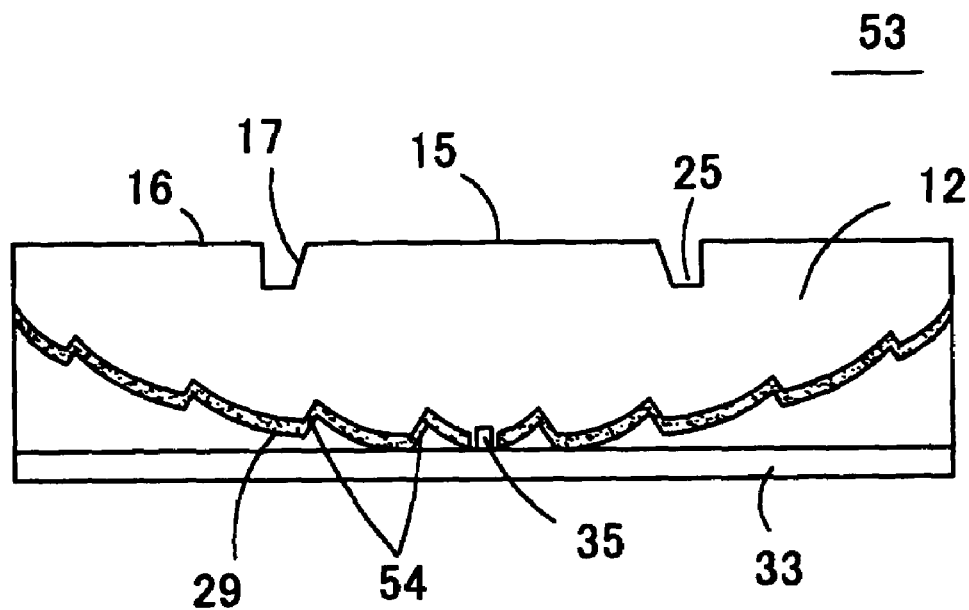

FIG. 30A is a perspective view showing a structure of a light emitting device 53 according to still another embodiment of the present invention, and FIG. 30B is a sectional view thereof. According to the light emitting device 53, a light emitting element 35 and a reflecting member 29 in the shape of Fresnel type of reflection plate are arranged on a support substrate 33, a mold part 12 is molded in the reflecting member 29 and a space between the reflecting member 29 and the support substrate, and a direct emitting portion 15, a total reflecting portion 16 and a groove 25 and the like are formed at a front face of the mold part 12. In addition, the reflecting member 29 constitutes a light reflection surface in which there is no discontinuity at bump portions 54 between its ring-shaped regions. Furthermore, the bump portion 54 does not have a vertical face and it has a slanted face in the direction opposite to the ring-shaped region. Still further, the light emitting device 53 is formed to be square or rectangular by cutting four portions of the circular light emitting device in design (see FIGS. 27B, 27C and 27D).

According to the circular light emitting device, since its outer peripheral face is surrounded with the reflecting member, light will not emitted from the light emitting device just beside. However, when the peripheral portions of the light emitting device are cut to be polygonal, square or rectangular, for example, there is generated a clearance between the front face of the mold part 12 and an edge of the reflecting member 29 like the light emitting device 53 shown in FIG. 30A. Therefore, the light totally reflected by the total reflecting portion 16 leaks from this clearance on the side face, which lowers light usability due to loss of light.

Figure 31:
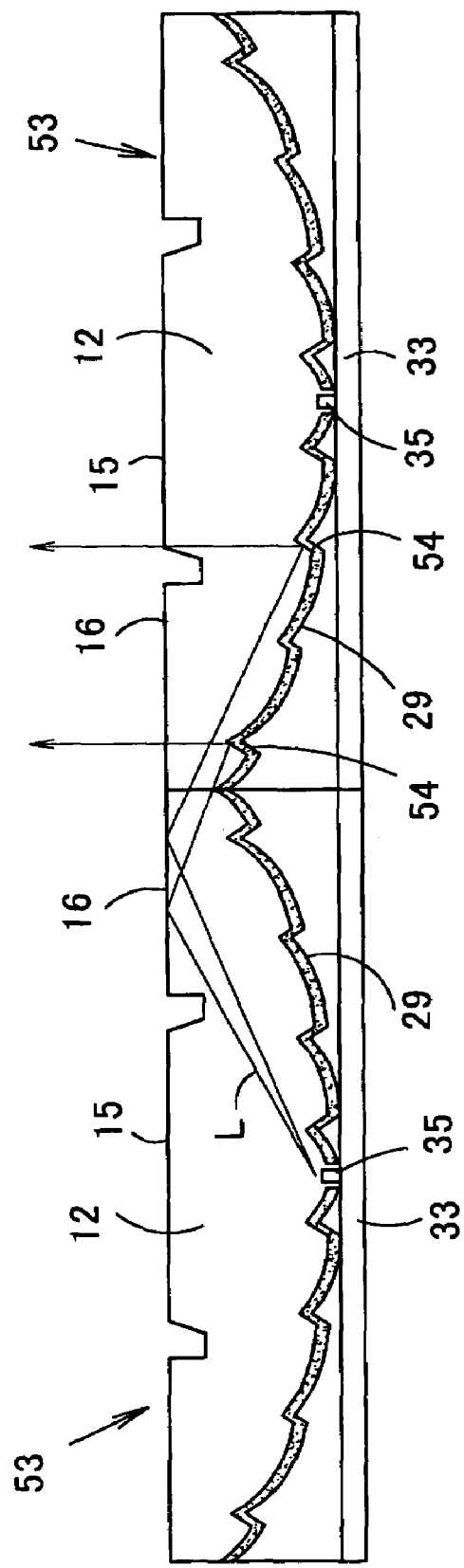
FIG. 31 shows a sectional view of a state in which a plurality of the above light emitting device are arranged.

FIG. 31 is a sectional view for explaining a state in which a plurality of the light emitting devices 53 shown in FIGS. 30A and 30B are arranged. When the plural light emitting devices 53 are arranged lineally or flatways, as shown in FIG. 31, the light L which was totally reflected by the total reflecting portion 16 and leaked from the clearance of the side face of the light emitting device 53 enters into the adjacent light emitting device 53. The slanted bump portions 54 provided at the reflecting member 29 are designed so as to reflect forward the light L which entered from the clearance at the side face. Therefore, when the light L which leaked from the clearance at the side face of the light emitting device 53 enters into the adjacent light emitting device 53, it is reflected by the slanted bump portion 54 and emitted from the adjacent light emitting device 53 toward the front face. Thus, according to the light emitting devices 53 in this embodiment, they can be arranged leaving no space among them and light usability can be improved by reducing loss of light.

FIGS. 32A and 32B are side and front views showing a light source apparatus 55 in which square or rectangular light emitting devices 57 (light emitting device 53 shown in FIGS. 30A and 30B, for example) according to the present invention are arranged on the whole surface of a substrate 56 leaving no space among them. Since each light emitting device 57 has a relatively large light emitting area and emits light uniformly, when those light emitting devices are arranged closely, there can be provided the large light source apparatus 55 which can emit light uniformly as a whole.

FIGS. 32C and 32D are side and front views showing a light source apparatus 58 in which the conventional light emitting devices 60 (cannonball-shaped LED, for example) are arranged at the same pitch on the whole surface of a substrate 59. According to the light source apparatus 58, respective light emitting devices 60 are noticeably lumpy and there is considerable luminance unevenness. Meanwhile, according to the light source apparatus 55 shown in FIGS. 32A and 32B, light emitting can be uniformly performed with no luminance unevenness.

(Fifteenth Embodiment)

Figure 33A:
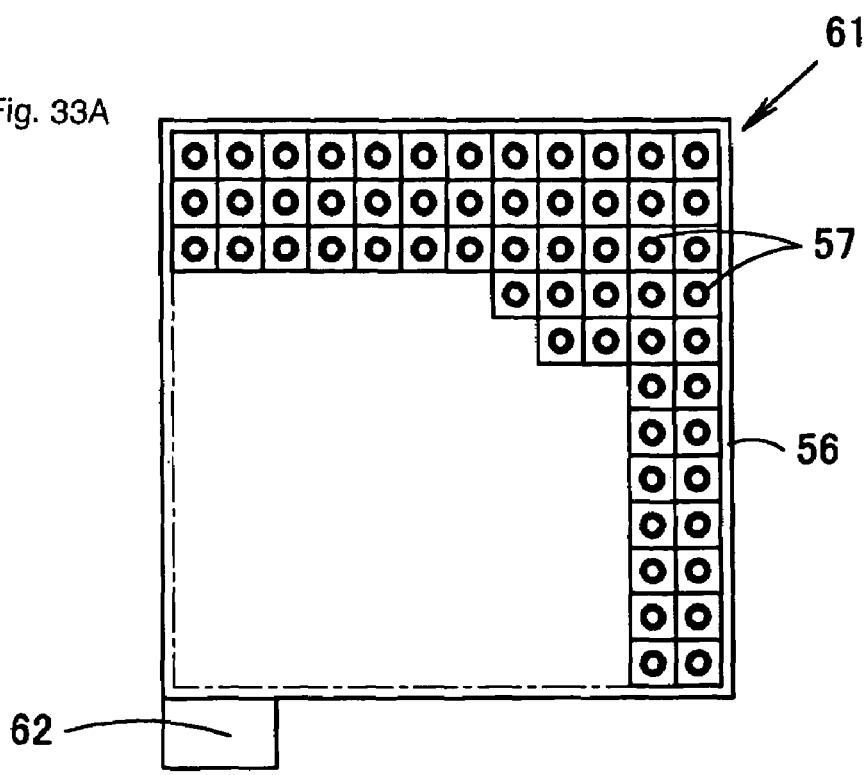
FIG. 33A shows a front view of a luminaire according to the present invention and FIG. 33B shows a side view of a state in which the luminaire is hung on a wall.
Figure 33B:
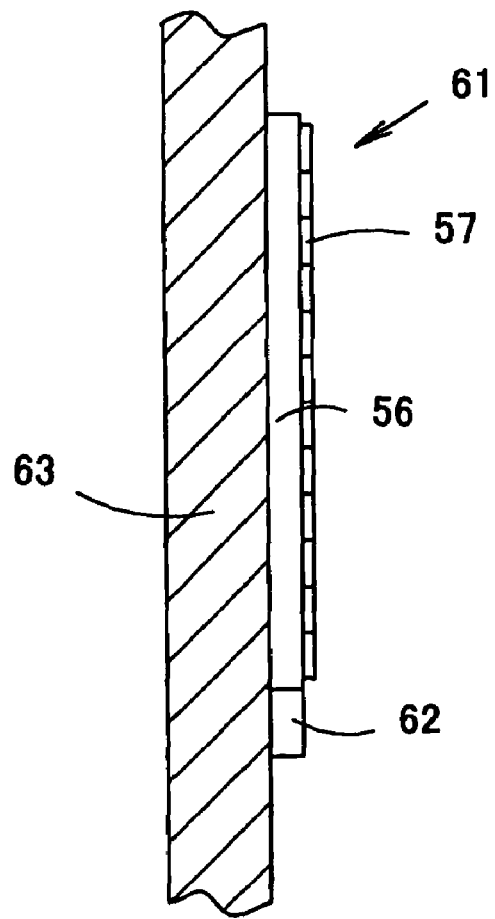

FIG. 33A is a front view showing a variation of a light emitting device according to the present invention, that is, a luminaire 61 in which a power supply unit 62 such as a battery is added to the light source apparatus 55 shown in FIGS. 32A and 32B. According to the luminaire 61, there can be provided the thin and large luminaire 61 which can emit light uniformly. Therefore, as shown in FIG. 33B, the apparatus can be hung on a wall 63 or a pillar, or put in the wall 63 or the pillar. Furthermore, since it is light in weight, it can be easily carried.

(Sixteenth Embodiment)

Figure 34A:
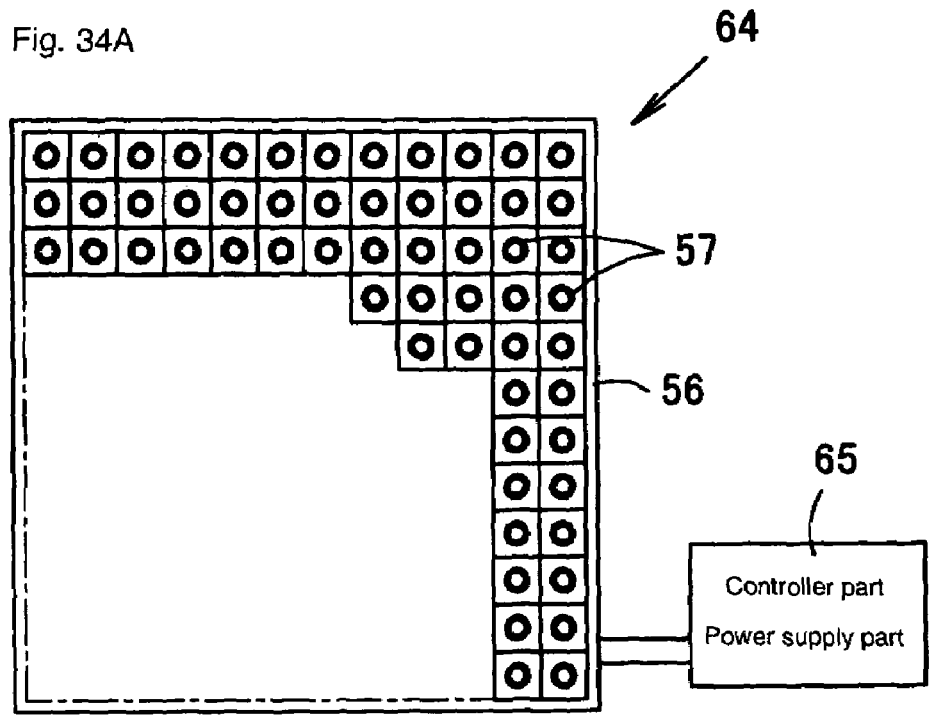
FIG. 34A shows a front view of a display unit according to the present invention and FIG. 34B shows a perspective view of the display unit mounted on a stand.

FIG. 34A is a front view showing a display unit 64 using the light emitting devices according to the present invention, in which a controller and a power supply part 65 are added to the light source apparatus 55 shown in FIGS. 32A and 32B. A light emitting element 35 of each light emitting device 57 comprises a red light emitting element such as a red LED or the like, a green light emitting element such as a green LED or the like and a blue light emitting element such as a blue LED or the like. A signal for controlling an emission light color and emission light intensity is transmitted from the controller and the power supply part 65 to each light emitting device 57, whereby desired full-color display is implemented, or the display can be varied. According to the display unit 64, uniform full-color light emission can be performed with high luminance, so that easily viewable display can be provided.

Figure 34B:
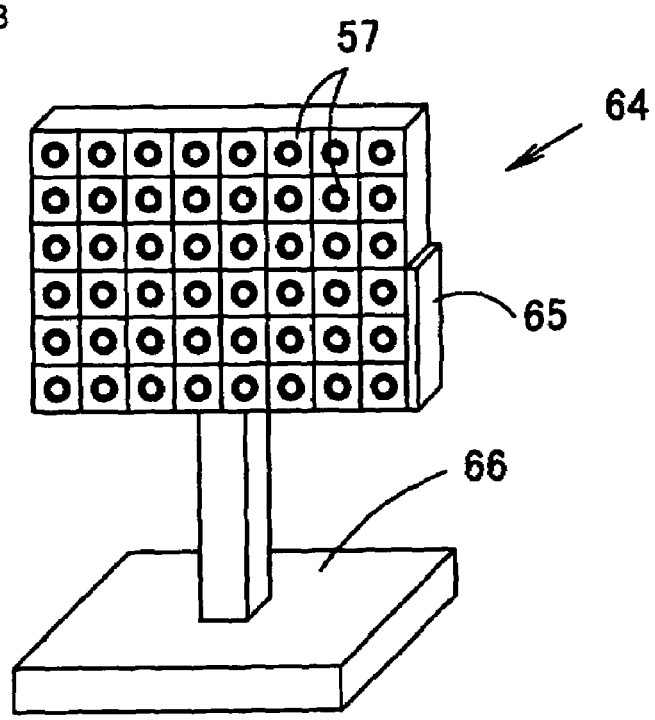

Although the display unit 64 can be hung on an interior wall or an exterior wall of a building, it maybe mounted on a stand 66 so as to be a self-supporting display unit as shown in FIG. 34B.

(Seventeenth Embodiment)

Figure 27A:
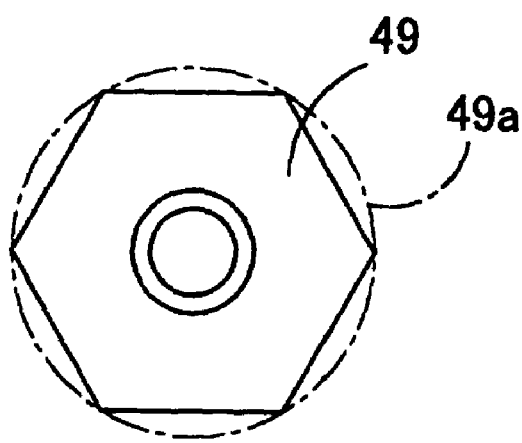
FIGS. 27A, 27B, 27C, and 27D show views of various kinds of front face configurations of the light emitting devices according to the present invention.
Figure 27B:
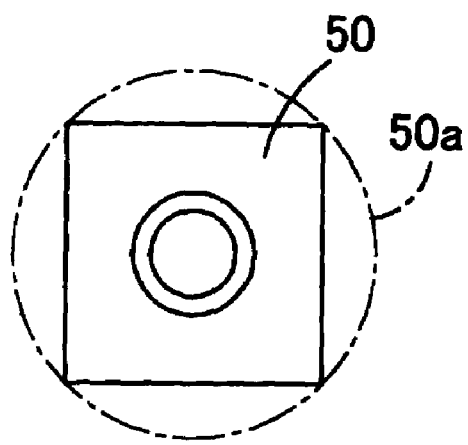
Figure 27C:
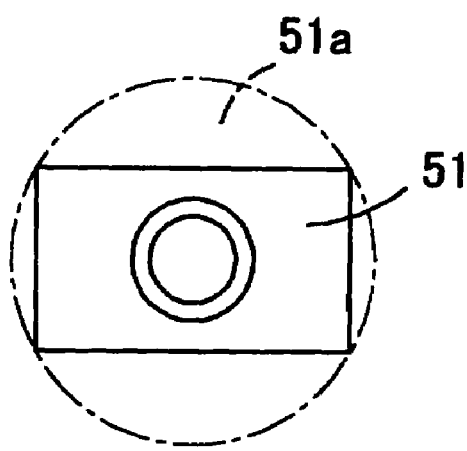
Figure 27D:
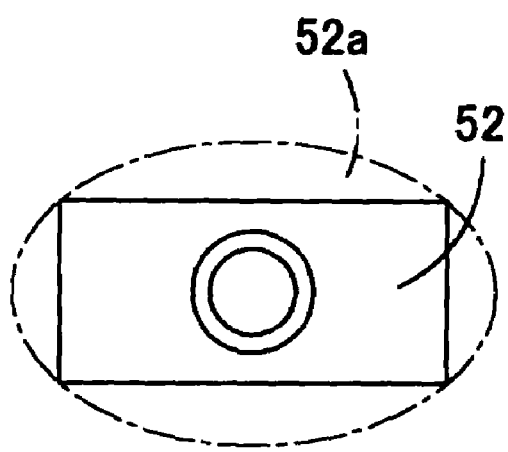
Figure 35A:
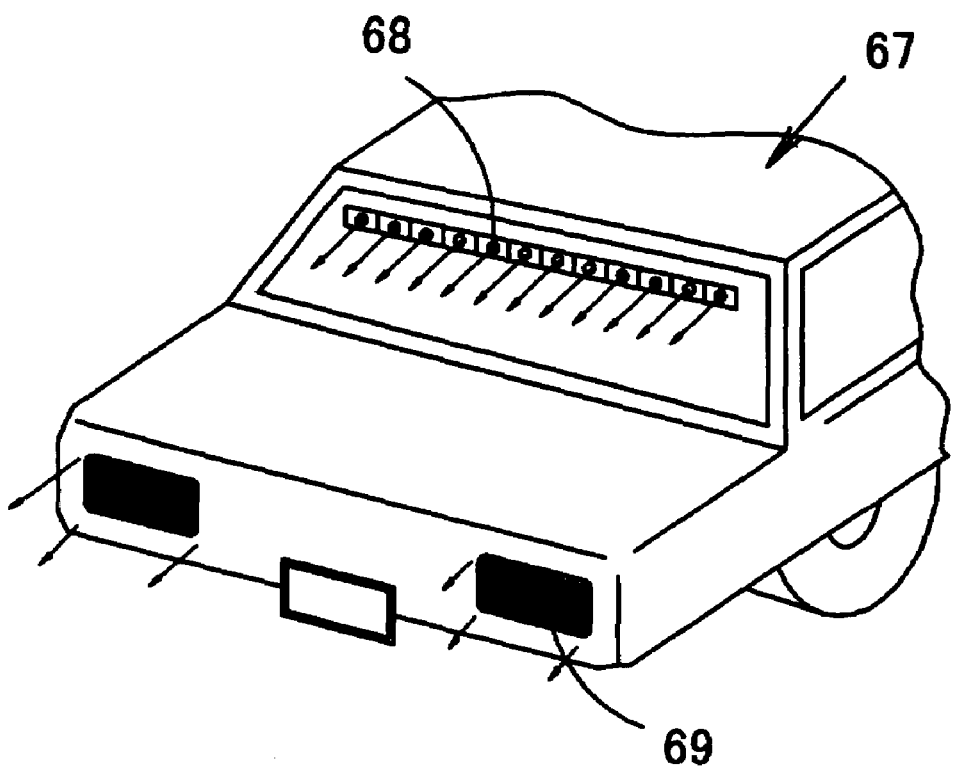
FIG. 35A shows a partially broken perspective view of a high-mounted stop lamp and a tail lamp mounted on a car.
Figure 35B:
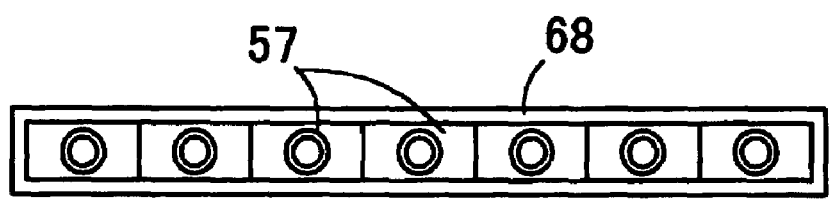
FIG. 35B shows a schematic front view of the high-mounted stop lamp provided in the car.
Figure 35C:
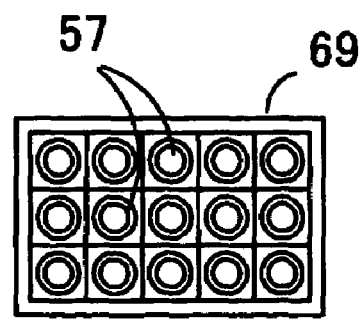
FIG. 35C shows a schematic front view of the tail lamp provided in the car.

FIG. 35A is a partially broken perspective view showing a variation for a car. As shown in FIG. 35B, a high-mounted stop lamp 68 in which a plurality of light emitting devices 57 according to the present invention are arranged in a line is mounted on an inside of a rear window of a car 67. In addition, as shown in FIG. 35C, a tail lamp 69 in which light emitting devices according to the present invention are arranged two-dimensionally is mounted on a rear end of the car 67. In addition, as the light emitting device 57, hexagonal one as shown in FIG. 27A may be used.

(Eighteenth Embodiment)

Figure 36B:
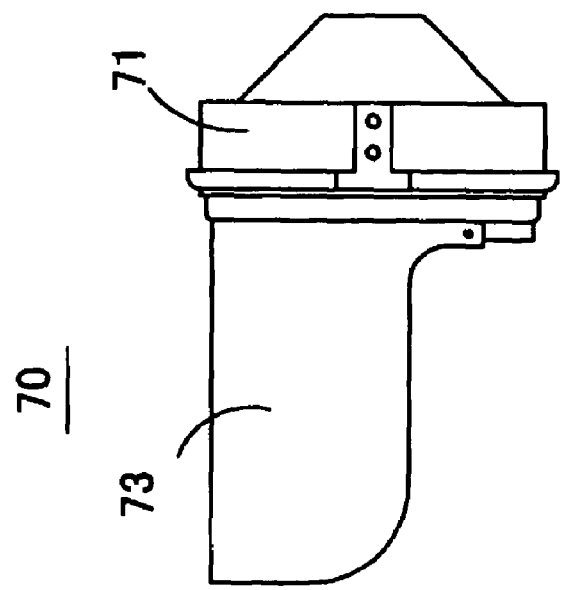
FIG. 36A shows a front view of a traffic light body and FIG. 36B shows a side view of a traffic light.
Figure 36A:
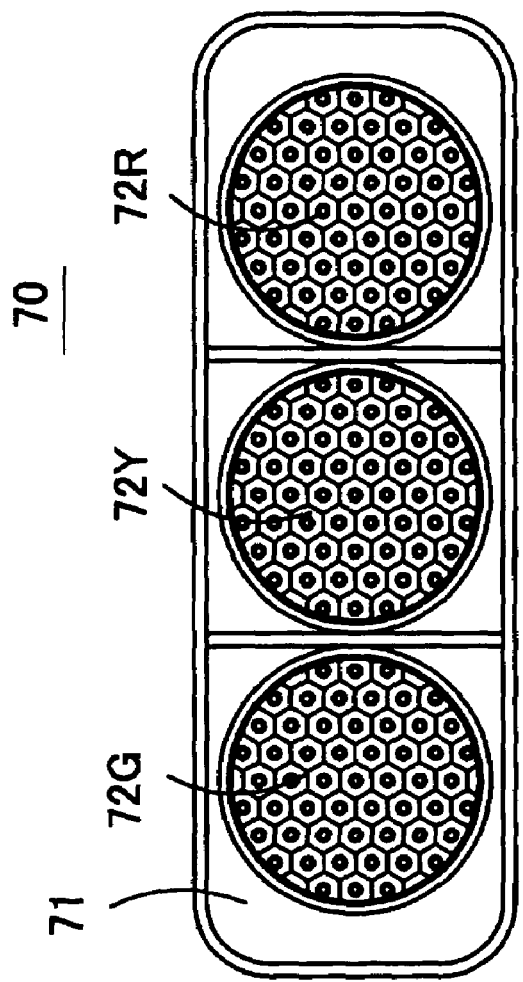
Figure 37:
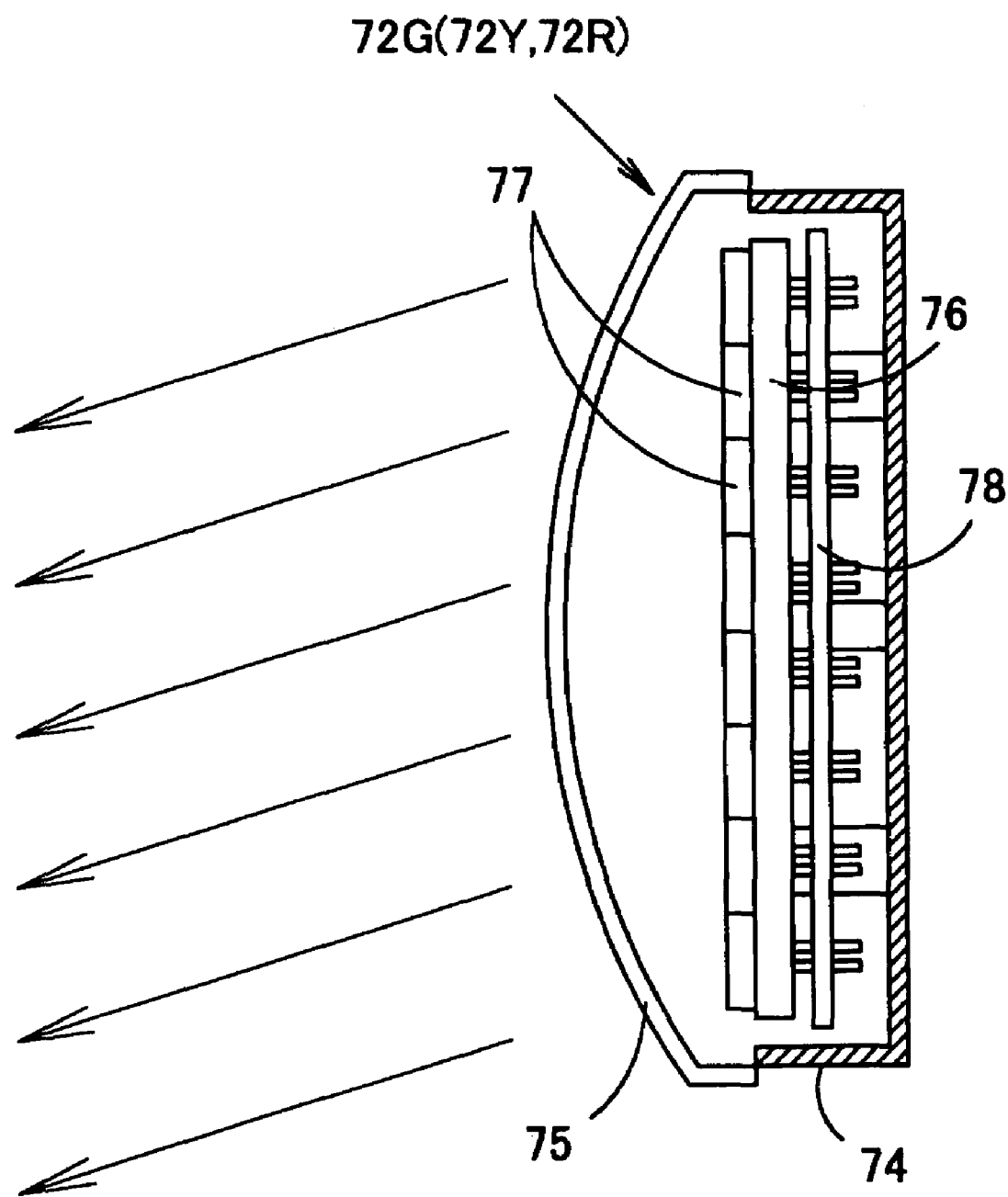
FIG. 37 shows a schematic sectional view of a structure of a green lamp, a yellow lamp or a red lamp.

FIG. 36A is a front view showing a traffic light body 71 and FIG. 36B is a side view of a traffic light 70 in which a light shielding cover 73 in the shape of an apprentice is mounted on the light body 71. As shown in FIG. 36A, a green lamp 72G emitting green light, a yellow lamp 72Y emitting yellow light, and a red lamp 72R emitting red light are provided in the traffic signal body 71. FIG. 37 is a schematic sectional view showing a structure of the green lamp 72G, the yellow lamp 72Y or the red lamp 72R. Each of the lamps 72G, 72Y and 72R houses a light source apparatus mounted on a circuit substrate 78 in a case 74 in which the front face is opened, and its front face is covered with a colored semi-transparent cover 75. In the light source apparatus, light emitting devices 77 according to the present invention for each green light emission, yellow light emission or red light emission are arranged on a front face of a substrate 76 leaving no space among them.

In addition, since the traffic light 70 is set at a high position in general, its light emission direction is preferably oriented downward so as to be easily viewable from the ground. In order to implement it, the circuit substrate 78 may be inclined downward at a slant, or each light emitting device 77 may be inclined on the light emitting device 46.

As described above, according to the light emitting device of the present invention, since the second total reflecting portion is provided, the distribution of the light which is emitted from the light guiding member can be controlled by changing its position, configuration or the like. As a result, the distribution of the front face luminance of the light emitting device can be uniformly implemented.

What is claimed is:

1. A light emitting device comprising a reflecting member for reflecting light, a light guiding member arranged at the side of a light reflecting surface of said reflecting member, and a light emitting element for emitting light toward said light guiding member, characterized in that the surface of the light emitting side of said light guiding member comprises a direct emitting portion for directly passing the light emitted from said light emitting element through to be emitted toward the outside of the light guiding member; a first total reflecting portion for totally reflecting the light emitted from the light emitting element toward said reflecting member and passing the light reflected by the reflecting member through to be emitted toward the outside of the light guiding member; and a second total reflecting portion configured so that the light emitted from the light emitting element is totally reflected toward the direct emitting portion, the light totally reflected by the direct emitting portion is directed to said reflecting member, and the light reflected by the reflecting member is emitted toward the outside of the light guiding member.

2. The light emitting device according to claim 1, characterized in that said second total reflecting portion is configured so that at least a part of the light reflected by said reflecting member after totally reflected by the second total reflecting portion and said direct emitting portion is emitted from a region in which neither the light passing through said direct emitting portion nor the light reflected by said first total reflecting portion and said reflecting member is emitted.

3. The light emitting device according to claim 1, characterized in that the surface of the light emitting side of said light guiding member comprises a third total reflecting portion in which the light emitted from said light emitting element is totally reflected toward said reflecting member, and the light reflected by the reflecting member is emitted to the outside of the light guiding member; and the third total reflecting portion and the first total reflecting portion are positioned at different distances from said light emitting element.

4. The light emitting device according to claim 3, characterized in that said third total reflecting portion and said second total reflecting portion are arranged adjacently with each other.

5. The light emitting device according to claim 1, characterized in that said reflecting member comprises a region in which the light totally reflected by said first total reflecting portion is reflected, and a portion in which the light totally reflected by said second total reflecting portion and said direct emitting portion is reflected.

6. The light emitting device according to claim 3, characterized in that said reflecting member comprises a region in which the light totally reflected by said first total reflecting portion is reflected, a portion in which the light totally reflected by said second total reflecting portion and said direct emitting portion is reflected, and a portion in which the light totally reflected by third total reflecting portion is reflected.

7. The light emitting device according to claim 5, characterized in that said reflecting member further comprises a portion in which the light emitted from said light emitting element is reflected to be directly emitted from the surface of said light guiding member.

8. The light emitting device according to claim 1, characterized in that the whole of the surface of the light emitting side of said light guiding member is covered with a light transmitting medium having a refractive index different from that of the light guiding member.

9. The light emitting device according to claim 1, characterized in that a light transmitting portion in which light diffusing elements or phosphors are dispersed is formed between said light emitting element and said light guiding member.

10. A light emitting apparatus in which a plurality of the light emitting devices according to claim 1 are connected to each other, characterized in that the reflecting member is configured so that the light which was leaked from one of the adjacent light emitting devices to the light guiding member of a light emitting device is reflected by the reflecting member of the light emitting device and emitted from the surface of the light emitting device.

11. A luminaire comprising a light emitting apparatus in which a plurality of light emitting devices according to claim 1 are arranged, and a power supply unit supplying a power to said light emitting apparatus.

12. A display unit comprising a light emitting apparatus in which a plurality of light emitting devices according to claim 1 are arranged, and a controller controlling lighting of each light emitting device which constitutes said light emitting apparatus.

13. The light emitting device according to claim 6, characterized in that said reflecting member further comprises a portion in which the light emitted from said light emitting element is reflected to be directly emitted from the surface of said light guiding member.

* * * * *